(12) United States Patent
Nakamura

(10) Patent No.: US 11,277,552 B2
(45) Date of Patent: Mar. 15, 2022

(54) IMAGE SENSOR AND IMAGE PICKUP APPARATUS HAVING THE SAME

(71) Applicant: CANON KABUSHIKI KAISHA, Tokyo (JP)

(72) Inventor: Keita Nakamura, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/924,256

(22) Filed: Jul. 9, 2020

(65) Prior Publication Data
US 2021/0021741 A1   Jan. 21, 2021

(30) Foreign Application Priority Data
Jul. 19, 2019  (JP) .............................. JP2019-133262

(51) Int. Cl.
| | | |
|---|---|---|
| *H01L 27/146* | (2006.01) | |
| *H04N 5/225* | (2006.01) | |
| *H04N 9/04* | (2006.01) | |
| *G01J 3/447* | (2006.01) | |

(52) U.S. Cl.
CPC ............ *H04N 5/2254* (2013.01); *G01J 3/447* (2013.01); *H01L 27/14621* (2013.01); *H01L 27/14625* (2013.01); *H04N 9/0455* (2018.08)

(58) Field of Classification Search
None
See application file for complete search history.

(56) References Cited

U.S. PATENT DOCUMENTS

| | | | |
|---|---|---|---|
| 10,515,999 B2 | 12/2019 | Segawa | |
| 2009/0290039 A1* | 11/2009 | Kanamori | ............. G01J 3/2803 348/222.1 |
| 2013/0270421 A1* | 10/2013 | Kanamori | .......... A61B 1/00186 250/208.1 |
| 2014/0092227 A1* | 4/2014 | Kanamori | ................ G01J 4/04 348/68 |
| 2015/0206912 A1* | 7/2015 | Kanamori | ......... H01L 27/14643 250/208.1 |
| 2016/0269694 A1* | 9/2016 | Masuda | ............... H04N 9/0451 |
| 2018/0277584 A1* | 9/2018 | Maruyama | ........ H01L 27/14623 |

FOREIGN PATENT DOCUMENTS

| | | |
|---|---|---|
| JP | 2017038011 A | 2/2017 |
| JP | 2017076684 A | 4/2017 |
| WO | 2015015722 A1 | 2/2015 |

* cited by examiner

*Primary Examiner* — Twyler L Haskins
*Assistant Examiner* — Wesley J Chiu
(74) *Attorney, Agent, or Firm* — Rossi, Kimms & McDowell LLP

(57) ABSTRACT

An image sensor includes a first and a second polarizing pixels in each of which transmission axis direction is different. Each of the first and second polarizing pixels has a same wavelength characteristic in transmittance, and has a sensitivity to a first and a second wavelength bandwidths. In each of the first and second polarizing pixels, a ratio of the transmittance in the transmission axis direction in the first and second wavelength bandwidths to a maximum value of the transmittance in the transmission axis direction in all wavelength bandwidths is 0.5 or more. In one of the first and second wavelength bandwidths, a ratio of the transmittance in a direction orthogonal to the transmission axis direction to the transmittance in the transmission axis direction is 0.5 or less, and in the other, the ratio is 0.5 or more.

15 Claims, 17 Drawing Sheets

POLARIZING
PIXEL ARRAY123

POLARIZING
PIXEL ARRAY123

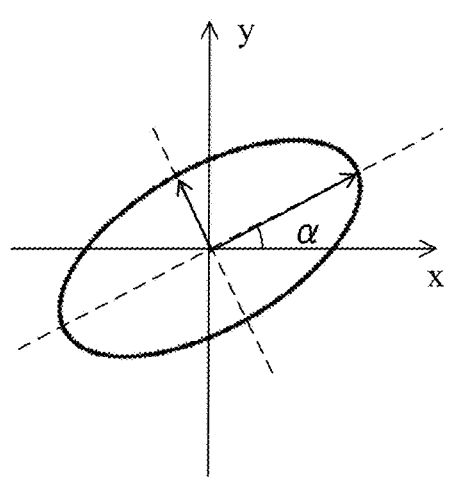 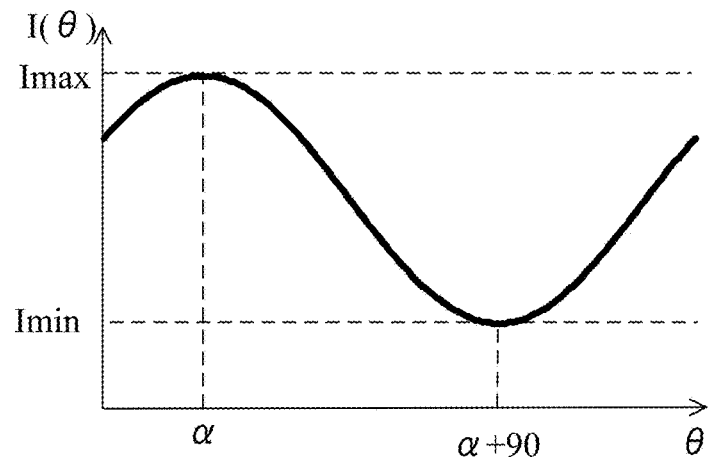
FIG. 7A                FIG. 7B
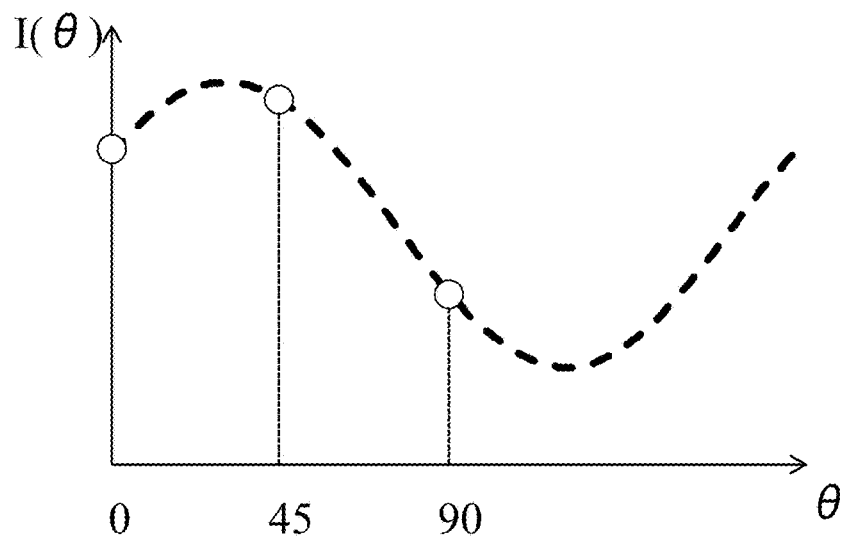
FIG. 8

| R1 | G1 | R2 | G2 |
|----|----|----|----|
| G1 | B1 | G2 | B2 |
| R2 | G2 | R1 | G1 |
| G2 | B2 | G1 | B1 |

FIG. 9A

| R1 | G3 | B2 | R1 | G3 | B2 |
|----|----|----|----|----|----|
| B3 | R2 | G1 | B3 | R2 | G1 |
| G2 | B1 | R3 | G2 | B1 | R3 |
| R1 | G3 | B2 | R1 | G3 | B2 |
| B3 | R2 | G1 | B3 | R2 | G1 |
| G2 | B1 | R3 | G2 | B1 | R3 |

FIG. 9B

| R1 | R4 | G1 | G4 |
|----|----|----|----|
| R2 | R3 | G2 | G3 |
| G1 | G4 | B1 | B4 |
| G2 | G3 | B2 | B3 |

FIG. 9C

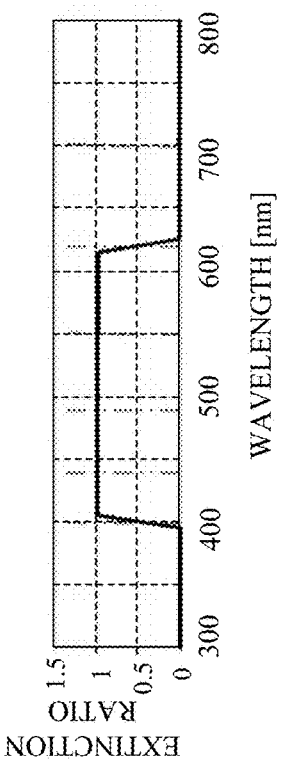
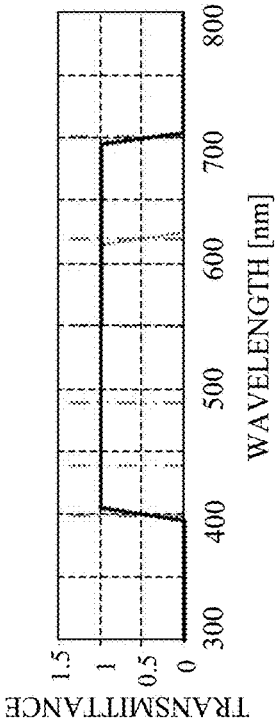
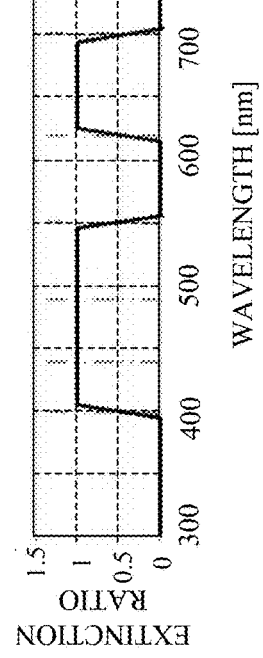
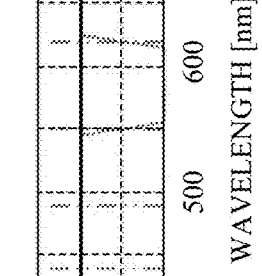
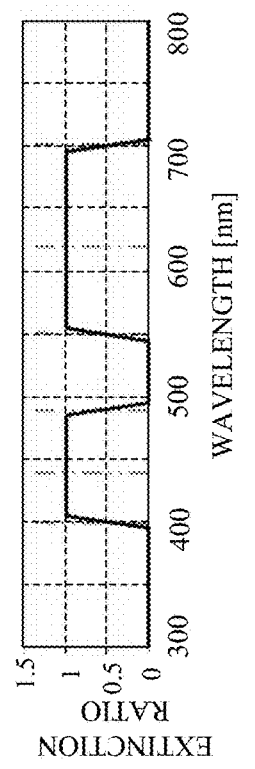
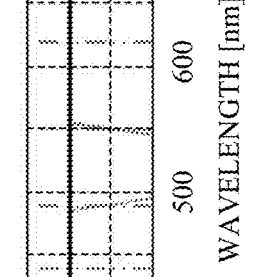
FIG. 14A
FIG. 14B
FIG. 14C

IMAGE SENSOR AND IMAGE PICKUP APPARATUS HAVING THE SAME

BACKGROUND OF THE INVENTION

Field of the Invention

The present invention relates to an image sensor that can acquire polarization component information, and an image pickup apparatus having the same.

Description of the Related Art

A characteristic of an object can be emphasized and detected by observing a polarized state of a reflected light from the object. For example, by attaching a polarizing filter to front of an imaging lens and by imaging the object, an image can be acquired in which a texture such as a color and contrast of the object is emphasized, or in which a reflected light on a water surface or the like is emphasized or reduced. Further, an edge and a defect of the object can be detected by acquiring polarization component information in different polarization directions from the object.

Japanese Patent Laid-Open No. ("JP") 2017-38011 discloses an image sensor having a light detecting layer including an organic photoelectric converting layer and a light detecting layer including an inorganic photoelectric converter, in order to acquire various information on the object. That is, the image sensor includes pixels each of which has two light receiving elements.

In the image sensor disclosed in JP 2017-38011, the organic photoelectric converting layer absorbs a polarized light of a specific wavelength, and the inorganic photoelectric converter absorbs a remaining light. In the organic photoelectric converting layer absorbing the polarized light of the specific wavelength in a predetermined azimuth, if the absorption is suppressed of a light orthogonal to the polarized light, an absorptance also decreases of the polarized light in the predetermined azimuth, and part of the polarized light in the predetermined azimuth enters the organic photoelectric converter. In such a case, a separation accuracy decreases of a polarization component in an incident light, and a calculation accuracy decreases of the polarization information such as a polarization degree and a polarization azimuth. On the other hand, if the organic photoelectric converting layer increases the absorption of the light orthogonal to the polarized light in order to improve the calculation accuracy for the polarization information, the polarized light decreases of the specific wavelength incident on the organic photoelectric converter, and the sensitivity decreases of the inorganic photoelectric converter.

SUMMARY OF THE INVENTION

The present invention provides an image sensor that can suppress decreases in a sensitivity and in separation accuracy of a polarization component, and an image pickup apparatus having the same.

An image sensor as one aspect of the present invention includes a first polarizing pixel and a second polarizing pixel. Each transmission axis direction of each of the first and second polarizing pixels is different from each other. Each of the first and second polarizing pixels has a same wavelength characteristic in transmittance. Each of the first and second polarizing pixels has a sensitivity to a first wavelength bandwidth and a second wavelength bandwidth. In each of the first and second polarizing pixels, a ratio of the transmittance in the transmission axis direction in the first and second wavelength bandwidths to a maximum value of the transmittance in the transmission axis direction in all wavelength bandwidths is 0.5 or more. In one of the first and second wavelength bandwidths, a ratio of the transmittance in a direction orthogonal to the transmission axis direction to the transmittance in the transmission axis direction is 0.5 or less, and in the other of the first and second wavelength bandwidths, the ratio of the transmittance in the direction orthogonal to the transmission axis direction to the transmittance in the transmission axis direction is 0.5 or more.

An image pickup apparatus including the above image sensor also constitutes another aspect of the present invention.

Further features of the present invention will become apparent from the following description of exemplary embodiments with reference to the attached drawings.

BRIEF DESCRIPTION OF THE DRAWINGS

FIGS. 7A and 7B are diagrams illustrating the polarized state of the incident light and a light intensity for an incident angle.

FIG. 8 is a diagram illustrating a calculation example for the polarization information.

FIGS. 9A to 9C are diagrams illustrating an example of a polarizing pixel array in the image sensor according to a first embodiment.

FIGS. 14A to 14I are diagrams illustrating the transmittance characteristics of the polarizing color pixels in the image sensor according to a fifth embodiment.

DESCRIPTION OF THE EMBODIMENTS

Figure 1:
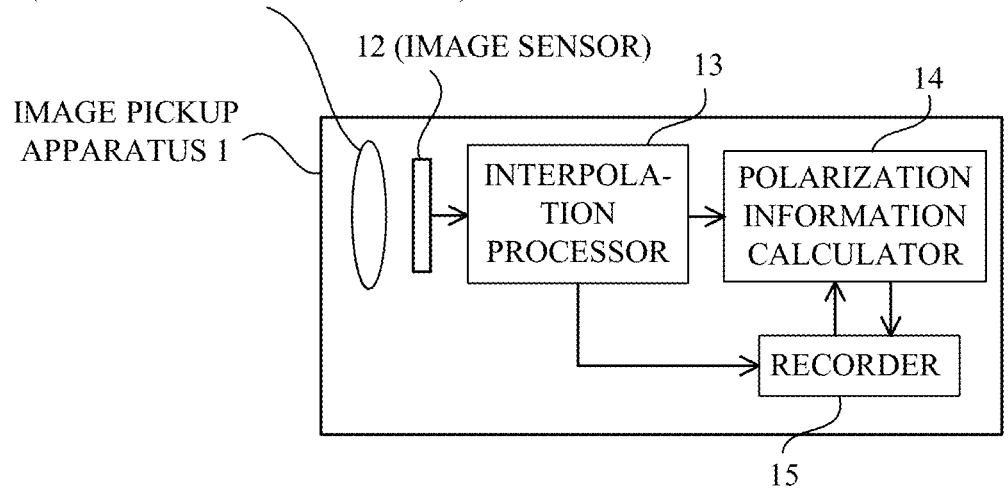
FIG. 1 is a diagram illustrating a configuration of an image pickup apparatus including an image sensor according to embodiments of the present invention.

Referring now to the accompanying drawings, a detailed description will be given according to the embodiments of the present invention. Corresponding elements in respective figures will be designated by the same reference numerals, and a description thereof will be omitted.

FIG. 1 is a diagram illustrating a configuration of an image pickup apparatus 1 having an image sensor 12 according to the embodiments of the present invention. The image pickup apparatus 1 includes an imaging optical system 11, the image sensor 12, an interpolation processor 13, a polarization information calculator 14, and a recorder 15. The imaging optical system 11 forms an object image as an optical image on an imaging plane of the image sensor 12.

Figure 2:
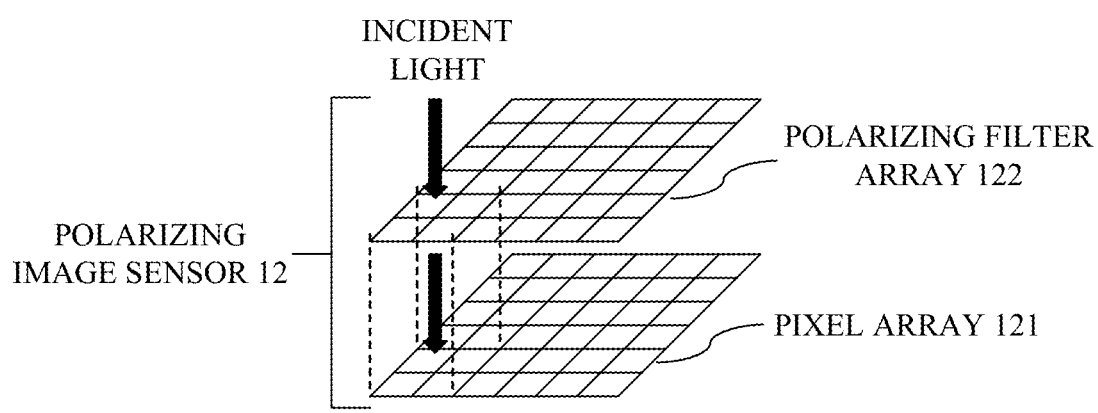
FIG. 2 is a diagram illustrating a configuration of the image sensor.

FIG. 2 is a diagram illustrating a configuration of the image sensor 12. The image sensor 12 includes a pixel array 121 having a plurality of pixels that are two-dimensionally arranged in a horizontal direction and a vertical direction on the imaging plane. The horizontal direction and the vertical direction are two directions orthogonal to each other. Each pixel of the pixel array 121 has one photoelectric converter. As the image sensor 12, a CCD sensor, a CMOS sensor or the like may be used. The image sensor 12 includes a polarizing filter array 122 having a plurality of two-dimensionally arranged polarizing filters on a light-receiving surface side of the pixel array 121. That is, the image sensor 12 includes the polarizing pixel array 123 having a plurality of polarizing pixels and having a polarizing filter function. The polarizing pixel array 123 is a pixel array in which the pixel array 121 and the polarizing filter array 122 are regarded as a unit.

Each polarizing pixel of the image sensor 12 has a higher transmittance for a specific polarization component than that for other polarization components. The polarizing pixel may have the same transmittance as that of the polarizing filter. However, for example, when the image sensor is formed by directly laminating the polarizing filter having a wire grid structure on the pixel array, it may be difficult to directly measure the transmittance of the polarizing filter. In this case, the transmittance is calculated by normalizing a luminance value (transmitted light intensity) detected at each polarizing pixel. For example, the transmittance in the polarizing pixel is set using a value normalized so that the luminance value is 1 in the wavelength where the transmitted light intensity takes a maximum value.

Figure 3:
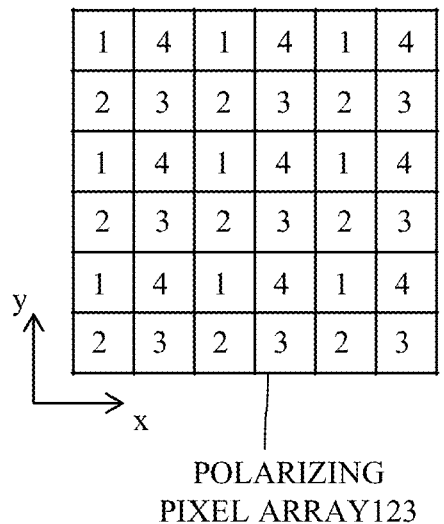
FIG. 3 is a diagram illustrating an example of a polarizing pixel array.

FIG. 3 is a diagram illustrating an example of the polarizing pixel array 123. An x-axis and a y-axis are parallel to the pixel array 121 and are orthogonal to each other. As long as this condition is satisfied, the directions of the x-axis and the y-axis may be different from those illustrated in FIG. 3. In FIG. 3, the polarizing pixel array 123 is a pixel array in which square array patterns of 6×6 pixels are repeatedly and two-dimensionally arranged in the x-axis direction (horizontal direction) and the y-axis direction (vertical direction). The repeating pattern is not limited to the square array pattern, and may be an arbitrary quadrangular array pattern or a polygonal array pattern such as an L-shape. The polarizing pixel array 123 may be a random pixel array having no repeating pattern.

A transmission axis of the polarizing pixel is an axis parallel to a polarization direction of the polarization component that maximizes the transmittance in each polarizing pixel, and an angle θ (0°≤θ<180°) as an angle between the transmission axis and the x-axis. An orthogonal axis is an axis orthogonal to the transmission axis and has an angle of θ+90° with the x-axis. Tp represents the transmittance in the transmission axis direction and Ts represents the transmittance in the orthogonal axis direction in the polarizing pixel. The extinction ratio ER represents the ratio Ts/Tp of the transmittances Ts and Tp.

In FIG. 3, the polarizing pixel array 123 is composed of the polarizing pixels of four different transmission axis directions θ1, θ02, θ3, and θ4 (indicated by 1, 2, 3, and 4 in the figure). The polarizing pixels of the transmission axis directions θ1, θ2, θ3, and θ4 (hereinafter referred to as θ1 pixel, θ2 pixel, θ3 pixel, and θ4 pixel, respectively) have main sensitivities to the polarization components in different polarization directions. That is, the polarizing pixel array 123 is composed of four polarizing pixel groups having different polarization sensitivity characteristics.

The polarizing pixel array 123 may include a pixel (non-polarizing pixel) that transmits the polarization component of any polarization direction. This embodiment defines the polarization component that can be acquired by the non-polarizing pixel as a non-polarization component, and defines the non-polarization component as one of the polarization components. The polarizing pixel array 123 may include a circular polarizing pixel having a high transmittance for one of a clockwise circularly polarized light and a counterclockwise circularly polarized light.

Figure 4:
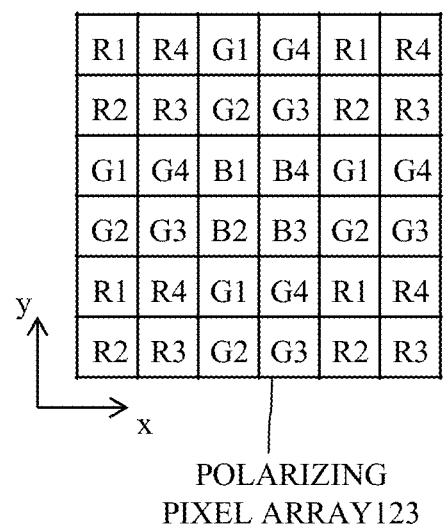
FIG. 4 is a diagram illustrating an example of a polarizing color pixel array.

The polarizing pixel may be a polarizing color pixel whose transmittance characteristic varies depending on the wavelength. The polarizing pixel array 123 is a polarizing color pixel array composed of a plurality of the polarizing color pixels having different wavelength characteristics in the transmittances. FIG. 4 is a diagram illustrating an example of the polarizing color pixel array. In the polarizing color pixel array in FIG. 4, each polarizing pixel group is composed of three types of color pixel groups of R, G and B. An alphabet and a number written on each pixel represent the color and the transmission axis direction, respectively.

Figure 5:
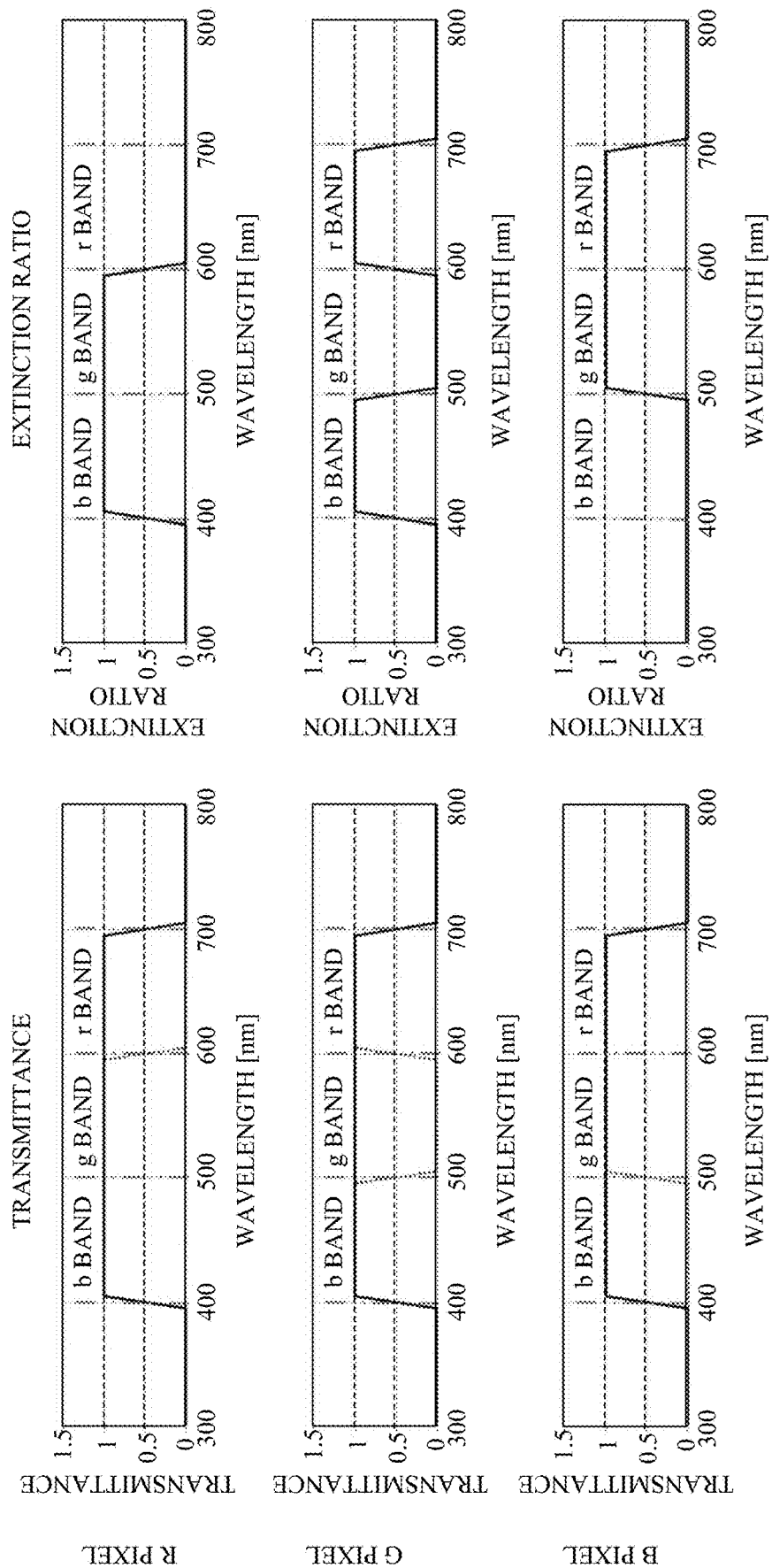
FIG. 5 provides diagrams illustrating wavelength characteristics in transmittances and extinction ratios in the polarizing color pixel.

FIG. 5 provides diagrams illustrating the wavelength characteristic in the transmittance and in the extinction ratio, of the polarizing color pixel. Each polarizing color pixel is configured to take Tp/Tp_max=1 (≥0.5) at each of three wavelength bandwidths of r (600 to 700 nm), g (500 to 600 nm), and b (400 to 500 nm). Tp_max represents the value of the transmittance Tp at the wavelength where the transmittance Tp is maximum in each polarizing color pixel. This embodiment defines the wavelength bandwidth in which Tp/Tp_max is 0.5 or more as a transmitted wavelength bandwidth of the polarizing color pixel. In each polarizing color pixel in FIG. 5, the three wavelength bandwidths r, g, and b (r, g, and b bands in diagrams) are the transmitted wavelength bandwidths.

A transmitted wavelength bandwidth in the image sensor 12 is defined by the wavelength bandwidth included in any one of the transmitted wavelength bandwidths in the polarizing color pixel. In FIG. 5, the transmitted wavelength bandwidth in the image sensor 12 composed of the polarizing color pixels is the three wavelength bandwidths of the r, g, and b. That is, the image sensor 12 has the sensitivity to the three wavelength bandwidths of the r, g, and b. The wavelength bandwidth to which the image sensor 12 has the sensitivity is not limited to the r, g, and b wavelength bandwidths, and may be other visible light wavelength bandwidths, or infrared or ultraviolet wavelength bandwidths.

For each wavelength bandwidth, at least one polarizing color pixel has different transmittance characteristic in the wavelength bandwidth. In this embodiment, when, between two wavelength bandwidths, the difference of average values of the transmittances of each polarizing color pixel is 0.1 or less and the difference of the average values of the extinction ratios of each polarizing color pixel is 0.1 or less, the two wavelength bandwidths are regarded as the same wavelength bandwidth. In the image sensor 12 including the color pixel groups having the wavelength characteristics illustrated in FIG. 5, for example, the wavelength bandwidths of 400 nm to 450 nm and 450 nm to 500 nm are regarded as one wavelength bandwidth (b wavelength bandwidth) because they have no difference in the average values of the transmittances of each pixel and in the average values of the extinction ratios of each pixel. Each wavelength bandwidth may not be a continuous wavelength bandwidth. If the transmittance characteristics are the same, the wavelength bandwidths composed of, for example, r wavelength bandwidth and b wavelength bandwidth are regarded as one wavelength bandwidth.

A wavelength bandwidth having a narrow bandwidth is not counted as one wavelength bandwidth. When each polarizing pixel group consists of Nc color pixel groups, each bandwidth is set so that a width is 0.5/Nc times or more of the width of the transmitted wavelength bandwidth. The image sensor 12 composed of the color pixel groups having the wavelength characteristics illustrated in FIG. 5 takes Nc=3, and the transmitted wavelength bandwidth has 300 nm width from 400 nm to 700 nm. Thus, the width of each wavelength bandwidth is not less than 50 (=300×0.5/3).

Now it is assumed that the transmittance in each wavelength bandwidth is the average value of the transmittance in each wavelength in each wavelength bandwidth, and the transmittance in an nw-th wavelength bandwidth is Tp (nw) and Ts (nw). The extinction ratio of the nw-th wavelength bandwidth is ER (nw) (=Ts (nw)/Tp (nw)). At this time, in the transmitted wavelength bandwidth of each color pixel group, a polarized transmitted wavelength bandwidth is defined by a wavelength bandwidth having the extinction ratio ER (nw) of 0.5 or less, and a non-polarized transmitted wavelength bandwidth is defined by the wavelength bandwidth having the extinction ratio ER (nw) of more than 0.5. In an R pixel of FIG. 5, the r wavelength bandwidth is the polarized transmitted wavelength bandwidth, and the g and b wavelength bandwidths are the non-polarized transmitted wavelength bandwidths. In a G pixel, the g wavelength bandwidth is the polarized transmitted wavelength bandwidth, and the r and b wavelength bandwidths are the non-polarized transmitted wavelength bandwidths. In a B pixel, the b wavelength bandwidth is the polarized transmitted wavelength bandwidth, and the r and g wavelength bandwidths are the non-polarized transmitted wavelength bandwidth. That is, in each color pixel group of FIG. 5, the transmitted wavelength bandwidth includes the polarized transmitted wavelength bandwidth and the non-polarized transmitted wavelength bandwidth.

The transmitted light intensity of each pixel indicates the sensitivity of the image sensor 12. When the incident light is a non-polarized light having the same polarization component in all the polarization directions, the transmitted light intensity is proportional to an average transmittance T. The following expression (1) expresses the average transmittance T in which the sum of the transmittances Tp (nw) and Ts (nw) is averaged by all the wavelength bandwidths.

$$T = \sum_{nw=1}^{Nw} \left[ \frac{W(nw)}{W} \frac{T_p(nw) + T_S(nw)}{2T_{p\_\max}} \right] \quad (1)$$

Nw represents the number of transmitted wavelength bandwidths, W (nw) represents the width of the nw-th wavelength bandwidth, and W represents the width of all the wavelength bandwidths. When the incident light is the polarized light, the intensity of the transmitted light varies depending on a relationship between the polarization direction of the incident light and the transmission axis direction of the pixel, but an average intensity of all the polarization directions is proportional to the average transmittance T. Thus, the larger the average transmittance T of the image sensor 12, the larger the transmitted light intensity and the better sensitivity the image sensor has. In the image sensor 12 composed of the color pixel groups illustrated in FIG. 5, the average transmittance T is 5/6.

Figure 6:
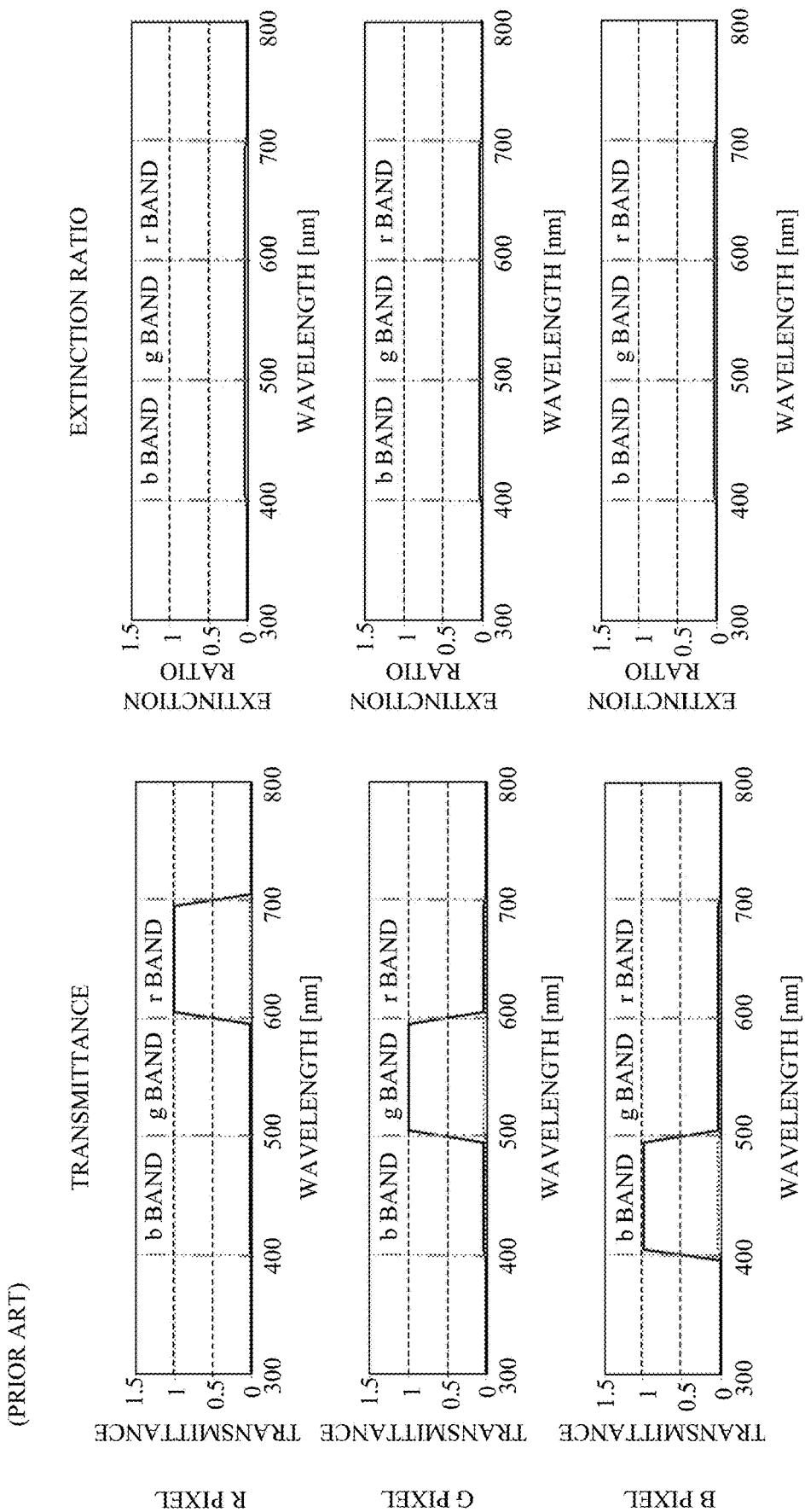
FIG. 6 provides diagrams illustrating transmittance characteristics of polarizing color pixels in the image sensor according to a comparative example 1.

FIG. 6 provides diagrams illustrating the wavelength characteristics in the transmittance and the extinction ratio, of the polarizing color pixel in the image sensor for the comparative example 1. The image sensor in the comparative example 1 is composed of a combination of the color filter that selectively transmits the wavelength bandwidths of the r, g, and b and the polarizing filter having the extinction ratio ER=0. The polarizing color pixel in the image sensor of the comparative example 1 transmits the polarized light in one polarization direction of some wavelength bandwidths only. Thus, each pixel can use part of the incident light only, decreasing an efficiency and the sensitivity.

On the other hand, the image sensor 12 in this embodiment has the polarizing color pixel in which the transmitted wavelength bandwidth includes the polarized transmitted wavelength bandwidth and the non-polarized transmitted wavelength bandwidths. The polarizing color pixel in the image sensor 12 transmits the polarized light of a plurality of the wavelength bandwidths, transmits the polarized light in one polarization direction in some of the plurality of wavelength bandwidths, and transmits the polarized light regardless of the polarization direction in the other wavelength bandwidths. While the image sensor in the comparative example 1 has the average transmittance T of 1/6, the image sensor 12 in this embodiment has the average transmittance T of 5/6, which is five times that of the comparative example 1. Thus, the image sensor 12 in this embodiment has high sensitivity because the image sensor 12 can use more incident light than the image sensor in the comparative example 1 while acquiring information on the polarization component.

In the image sensor 12 having the polarizing pixel array 123 in FIG. 4, each of all the color pixel groups of all the polarizing pixel groups transmits the transmitted wavelength bandwidth including the polarized transmitted wavelength bandwidth and the non-polarized transmitted wavelength bandwidth, but some pixel groups or some color pixel groups may transmit such a transmitted wavelength bandwidth. However, the more color pixel groups transmit the transmitted wavelength bandwidths including the polarized transmitted wavelength bandwidth and the non-polarized transmitted wavelength bandwidth, the larger the average transmittance T of the entire image sensor 12 becomes, and the higher sensitivity the image sensor 12 has. The pixels transmitting such a transmitted wavelength bandwidth may be all the polarizing pixel groups, may be all the color pixel groups, and may be all the color pixel groups in all the polarizing pixel groups.

In the image sensor 12 having the polarizing pixel array 123 in FIG. 4, the transmitted wavelength bandwidth of each polarizing color pixel includes all the wavelength bandwidths sensible for the image sensor 12, but may not include some of the wavelength bandwidths (a non-transmitted wavelength bandwidth) sensible for the image sensor 12. However, the wider wavelength bandwidth the transmitted wavelength bandwidth is, the larger the average transmittance T, and the higher sensitivity the image sensor 12 has. All the wavelength bandwidths sensible for the image sensor 12 may be the transmitted wavelength bandwidths of each polarizing color pixels.

The higher the transmittance in the transmitted wavelength bandwidth, the larger the average transmittance T and the higher sensitivity the image sensor 12 has. Thus, Tp/Tp_max may be 0.8 or more in the transmitted wavelength bandwidth.

On the other hand, the lower the transmittance in the non-transmitted wavelength bandwidth, the higher a performance for separating the non-transmitted wavelength bandwidth and the transmitted wavelength bandwidth. Thus, Tp/Tp_max may be 0.2 or less in the non-transmitted wavelength bandwidth.

A conditional expression 0.8≤Tpnc_max/Tpnc' max≤1.2 may be satisfied in any two polarizing color pixels (an nc-th color pixel and an nc'-th color pixel). Further, a conditional expression 0.8≤Tnc/Tnc'≤1.2 may be satisfied. Tpnc_max and Tnc are Tp_max and the average transmittance T in the nc-th color pixel, respectively. When each of Tp_max and the average transmittance T are approximately the same in each polarizing color pixel, an amount of the transmitted light is approximately the same for each polarizing color pixel, and thus errors are suppressed during denoising, interpolation processing, and polarization information calculation, and it is possible to acquire information with high-accuracy.

Various methods can provide the above-described polarizing color pixel with the transmitted wavelength bandwidth of the polarized transmitted wavelength bandwidth and the non-polarized transmitted wavelength bandwidth. For example, there are a method of using a color filter processed into a lattice shape, and a method of forming a minute dot structure made of a metal material, silicon, or the like.

Hereinafter, a description will be given of the interpolation processing on the information acquired by the image sensor 12 and of the calculation of the polarization information. Each pixel on the image sensor 12 converts an object image formed on an imaging surface of the image sensor 12 into charge according to the intensity of the incident light, and the charge is read out from the image sensor 12 as an electric signal (pixel signal). The pixel signal read out from the image sensor 12 is input to the interpolation processor 13 as luminance information for each pixel. The luminance information for each pixel includes the polarization component information according to the type of the pixel.

By extracting the luminance information from a specific type of the pixel among the plurality of types of pixels, a mosaic image can be acquired, the mosaic image consisting of the information on the polarization component and information on the wavelength component according to the type of the pixel only. The interpolation processor 13 calculates information not acquired in each pixel by performing demosaicing (interpolation) processing on this mosaic image, and generates interpolation information on the plurality of polarization components in each pixel.

The interpolation information generated by the interpolation processor 13 is input to the polarization information calculator 14. The interpolation information may be recorded on the recorder 15. The polarization information calculator 14 calculates the polarization information (α, Imax, Imin) representing the polarized state of the incident light. α represents the polarization direction that maximizes the light intensity, Imax represents the maximum value of the light intensity, and Imin represents the minimum value of the light intensity. In general, the polarization information has different values in each wavelength bandwidth.

Here, a method will be described of calculating the polarization information (α, Imax, Imin). Now assume that one wavelength component of the incident light entering the image sensor 12 can be expressed as illustrated in FIGS. 7A and 7B. The ellipse in FIG. 7A indicates an azimuth dependency of an amplitude of the incident light. The broken line in FIG. 7A represents a major axis and a minor axis of the ellipse, and a polarization direction α is represented by an angle formed by the major axis and the x axis. Arrows in FIG. 7A represent the amplitudes in the major axis direction and the minor axis direction. The square of the amplitude indicates the light intensity. FIG. 7B illustrates the luminance information according to the light intensity of the incident light forming the angle θ with the x axis, that is, the polarization component information I (θ) of the incident light in the polarization direction θ. Imax and Imin indicate the polarization component information corresponding to the polarization components in the major axis direction and the minor axis direction, respectively. The polarization component information I (θ) is expressed by the following expression (2).

$$I(\theta) = \frac{(Imax - Imin)}{2}\cos(2\theta - 2\alpha) + \frac{(Imax + Imin)}{2} \quad (2)$$

The expression (2) indicates that the polarization component information I (θ) varies in a cycle of 180° and is determined by the three coefficients (α, Imax, Imin). Thus, in order to calculate the polarization information, it is necessary to acquire at least three or more polarization component information I (θ) for the angle θ of 0° or more and less than 180°. FIG. 8 illustrates, as an example, three pieces of the polarization component information of θ=0°, 45°, and 90° represented by white circles, and the polarization component information I (θ) calculated from the three pieces of the polarization component information.

On the other hand, if the above conditions are satisfied, the polarization direction of the polarization component to be acquired is not particularly limited. Hence, the polarization information (α, Imax, Imin) can be calculated by acquiring arbitrary three or more pieces of the polarization component information I (θ).

The non-polarization component information corresponds to an average value Iave of the light intensities for all the polarized states.

$$Iave = \int_{0°}^{180°} I(\theta)d\theta = \frac{Imax + Imin}{2} \quad (3)$$

$$I(\theta)+I(\theta+90°)=I\max+I\min \quad (4)$$

Since the expressions (3) and (4) provides the light intensity I (θ+90°) of the polarization direction θ+90° using the average value Iave and the polarization component information I(θ), the non-polarization component information is considered as one of the polarization component information. For example, when it is possible to acquire the polarization component information and the non-polarization component information of θ=0° and 45°, it is possible to calculate the polarization component information of θ=90° and θ=135°, and to acquire four pieces of polarization component information.

When the polarization information is calculated using four or more pieces of the interpolation information, each piece of the polarization component information may not be able to uniquely determine the polarization information that satisfies the expression (1) due to an error or the like. In this case, a method such as a least squares method may approximately calculate the polarization information.

The following expression (5) represents polarization component information In of the transmitted light when the incident polarized light in FIG. 6(a) incidents on the polarizing pixel having the transmittances Tp and Ts and having a transmission axis azimuth θn.

$$I_n = (T_p - T_s)\frac{(Imax - Imin)}{2}\cos(2\theta_n - 2\alpha) + (T_p + T_s)\frac{(Imax + Imin)}{2} \quad (5)$$

When the transmitted wavelength bandwidth of the polarizing pixel is the first to Nw-th wavelength bandwidth, the following expression (6) represents the polarization component information acquired by the polarizing pixel, that is the sum of the polarization component information in each wavelength bandwidth.

$$I_{n,nc} = \sum_{nw=1}^{Nw}\left[(T_{p_{nc}}(nw) - T_{s_{nc}}(nw))\frac{(Imax(nw) - Imin(nw))}{2}\cos(2\theta_n - 2\alpha(nw)) + (T_{p_{nc}}(nw) + T_{s_{nc}}(nw))\frac{(Imax(nw) + Imin(nw))}{2}\right] \quad (6)$$

$I_{n,\,nc}$ represents the luminance information on the nc-th color pixel of the n-th polarization color pixel, Tpnc (nw) and Tsnc (nw) represent the transmittances of the nw-th wavelength in the nc-th color pixel, and (α(nw), Imax (nw), Imin (nw)) represents the polarization information on the n-th wavelength.

In order to calculate the polarization information on the first to the Nw-th wavelength bandwidths, it is necessary to acquire 3Nw pieces of the polarization component information, that are linearly independent of each other, in the polarizing color pixel. When N pieces of the luminance information are linearly independent of each other, combinations for ki satisfying the following expression (7) are ki=0 (i=1, 2, . . . , N) only for the N pieces of the polarization component information Ii acquired when the incident polarized light of any polarization state enters the pixel.

$$\sum_{i=1}^{N} k_i I_i = 0 \quad (7)$$

In order to acquire the 3Nw pieces of the luminance information that are linearly independent of each other from the polarizing color pixels, it is necessary that at least three polarizing pixels are provided, that at least Nw vectors V1 (nc) are linearly independent of each other, and that at least Nw vectors V2 (nc) are linearly independent of each other.

The vectors V1 (nc) and V2 (nc) are respectively composed of the differences and the sums of the transmittances Tpnc (nw) and Tsnc (nw) in the first to Nw-th wavelength bandwidths of the nc-th color pixel.

Conversely, when at least three polarizing pixels are provided, at least Nw vectors V1 (nc) are linearly independent of each other, and at least Nw vectors V2 (nc) are linearly independent of each other, it is possible to calculate the polarization information on the first to Nw-th wavelength bandwidths. Thus, the image sensor 12 may include at least three polarizing pixels and may be composed of the color pixel groups satisfying the above described linear independent condition.

Even if the difference is small in the transmittance characteristics in each polarizing color pixel, it is possible to calculate the polarization information on each wavelength bandwidth when the above linear independent condition is satisfied. However, when the difference is small in the transmittance characteristics, if a detection error or an interpolation error occurs, the error increases in the polarization information calculation, and it is impossible to correctly calculate the polarization information. In order to increase the difference in the transmittance characteristics in each polarizing color pixel, the polarized transmitted wavelength bandwidths may be different in each polarizing color pixel, and one wavelength bandwidth of the transmitted wavelength bandwidths may be the polarized transmitted wavelength bandwidth. When the polarization component information on the different wavelength bandwidth is acquired in each polarizing color pixel, the accuracy improves of calculating the polarization information on each wavelength bandwidth.

The extinction ratio ER may be 0.2 or less in the polarized transmitted wavelength bandwidth in each polarizing color pixel. Thereby, the difference in the transmittance characteristics increases between the polarizing color pixel that acquires the polarization component information and the non-polarizing color pixel that acquires the non-polarization component information, and polarization calculation accuracy improves.

The recorder 15 records the polarization information calculated by the polarization information calculator 14. The recorder 15 may record the polarization information alone, but may record the polarization information linked to the interpolation information used in the calculation.

In this embodiment, the image pickup apparatus 1 is configured to include the imaging optical system 11, but may be configured to use an interchangeable lens. The image pickup apparatus 1 includes the interpolation processor 13, the polarization information calculator 14, and the recorder 15, but does not necessarily include these, and may use an external apparatus having a function equivalent to these. For example, an external recording apparatus may record the image information output from the interpolation processor 13 or the polarization information calculated by the polarization information calculator 14. Instead of the interpolation processor 13 and the polarization information calculator 14, an external apparatus such as a personal computer (PC) may perform the demosaicing processing and the calculation of the polarization information.

First Embodiment

The image sensor 12 in this embodiment is composed of the three types of color pixel groups of R, G and B having the wavelength characteristic illustrated in FIG. 5. The image sensor 12 in this embodiment has sensitivity to three wavelength bandwidths of r, g, and b. In each color pixel group, Tp/Tp_max is 1 in each wavelength bandwidth. In the R pixel, the r wavelength bandwidth is the polarized transmitted wavelength bandwidth, and the g and b wavelength bandwidths are the non-polarized transmitted wavelength bandwidths. In the G pixel, the g wavelength bandwidth is the polarized transmitted wavelength bandwidth, and the r and b wavelength bandwidths are the non-polarized transmitted wavelength bandwidths. In the B pixel, the b wavelength bandwidth is the polarized transmitted wavelength bandwidth and the r and g wavelength bandwidths are the non-polarized transmitted wavelength bandwidths. That is, in each color pixel group in this embodiment, the transmitted wavelength bandwidth is composed of the polarized transmitted wavelength bandwidth and the non-polarized transmitted wavelength bandwidth.

In the image sensor 12 in this embodiment, the transmitted wavelength bandwidth is composed of the polarized transmitted wavelength bandwidth and the non-polarized transmitted wavelength bandwidth in all the color pixel groups of all the polarizing pixel groups. The transmitted wavelength bandwidth takes Tp/Tp_max of 0.8 or more in each color pixel group. Thus, the image sensor 12 in this embodiment has average transmittance T of 5/6, which is larger than that in the comparative example 1 (T=1/6), and is an image sensor having higher sensitivity than that in the comparative example 1.

Since Tp_max and the average transmittance T are equal in each polarizing color pixel and a transmitted light amount is approximately the same in each polarizing color pixel, the information can be acquired with high accuracy.

Since each color pixel group has the different polarized transmitted wavelength bandwidth of one wavelength bandwidth, and since the extinction ratio ER is as small as 0 in each polarized transmitted wavelength bandwidth, the polarization calculation accuracy increases.

FIGS. 9A to 9C are diagrams illustrating examples of the polarizing pixel array in the image sensor 12 in this embodiment. In the polarizing pixel array in this embodiment, the square array patterns are repeatedly arranged in each of the horizontal direction and the vertical direction. In FIGS. 9A to 9C, the polarizing pixel array is composed of two, three and four polarizing pixel groups, respectively. The smaller the number of the polarizing pixel groups, the larger a proportion of the pixels of the same type in the polarizing pixel array, and the higher a resolution. On the other hand, the larger the number of the polarizing pixel groups, the larger the acquired information, and the higher the accuracy of the polarization information calculation. As illustrated in FIGS. 9B and 9C, the image sensor including three or more polarizing pixels can calculate the polarization information of any incident light. Even when the image sensor consists of two polarizing pixels as illustrated in FIG. 9A, if the polarization direction α of the incident light is known by using a polarized illumination or by fixing the direction of a reflecting surface, it is possible to calculate the polarization information. Further, if it is known that the polarization degree is high, the minimum value Imin of the light intensity is 0, and thus it is possible to calculate the polarization information even when the image sensor consists of two polarizing pixels.

FIGS. 9A to 9C illustrate merely examples of the arrangements and the numbers of the polarizing pixel groups, and other arrangements and numbers may be used.

Second Embodiment

Figure 10:
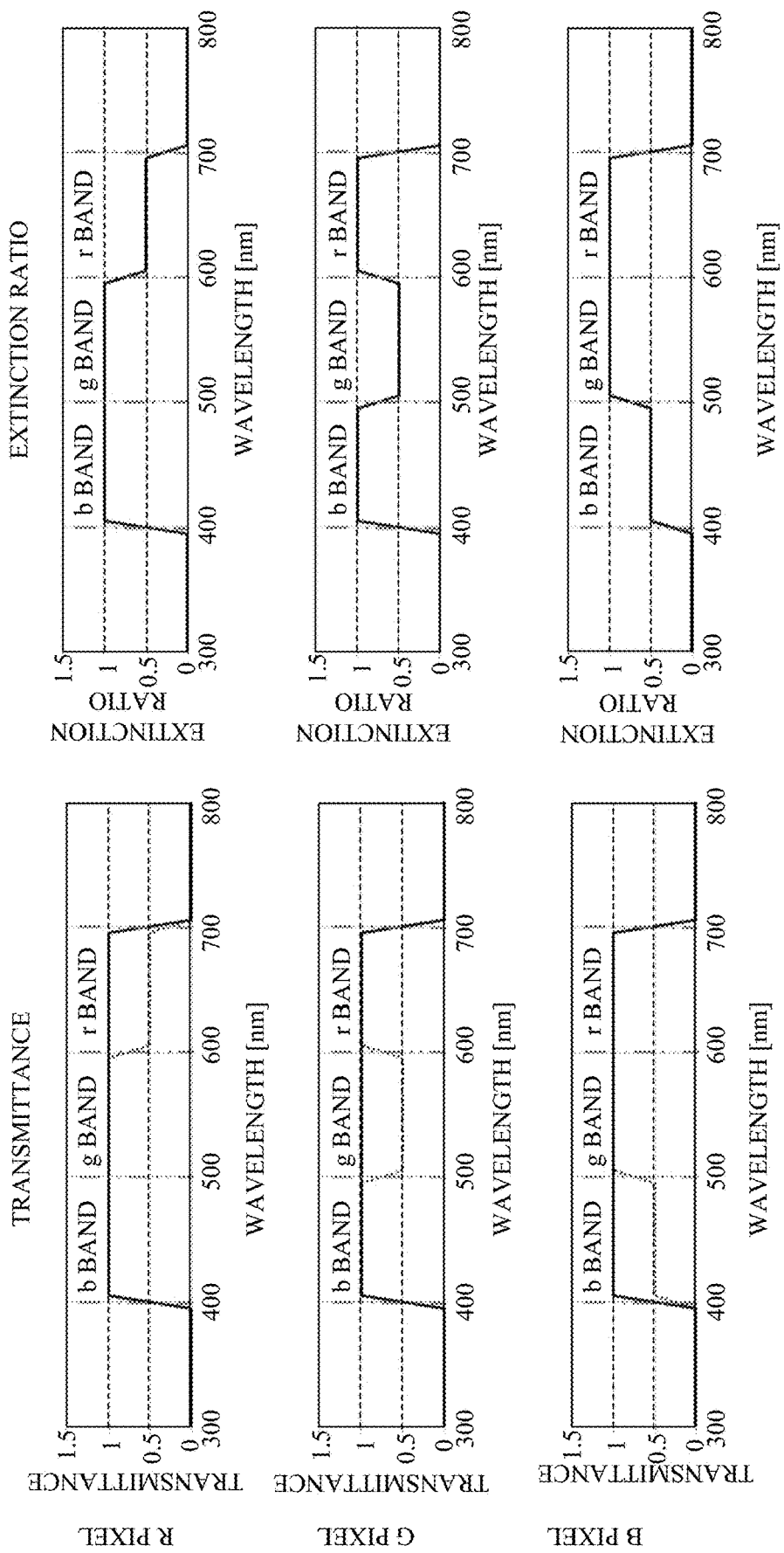
FIG. 10 provides diagrams illustrating the transmittance characteristics of the polarizing color pixels in the image sensor according to a second embodiment.

FIG. 10 provides diagrams illustrating the transmittance characteristics for the polarizing color pixels in the image sensor 12 in this embodiment. The image sensor 12 in this embodiment is composed of the three types of color pixel groups of R, G and B. In each color pixel group, the transmitted wavelength bandwidth is composed of the polarized transmitted wavelength bandwidth and the non-polarized transmitted wavelength bandwidth.

The image sensor 12 in this embodiment differs from the image sensor 12 in the first embodiment in that the extinction ratio ER is 0.5 in the polarized transmitted wavelength bandwidth in each color pixel group. Thus, the image sensor 12 in this embodiment has the average transmittance T of 11/12 in each polarizing color pixel, which is larger than that in the first embodiment (T=5/6), and is an image sensor having higher sensitivity than that in the first embodiment. On the other hand, since the extinction ratio ER is 0.5 in the polarized transmitted wavelength bandwidth, which is larger than that in the first embodiment, the calculation accuracy for the polarization information is lower than that in the first embodiment.

Third Embodiment

Figure 11:
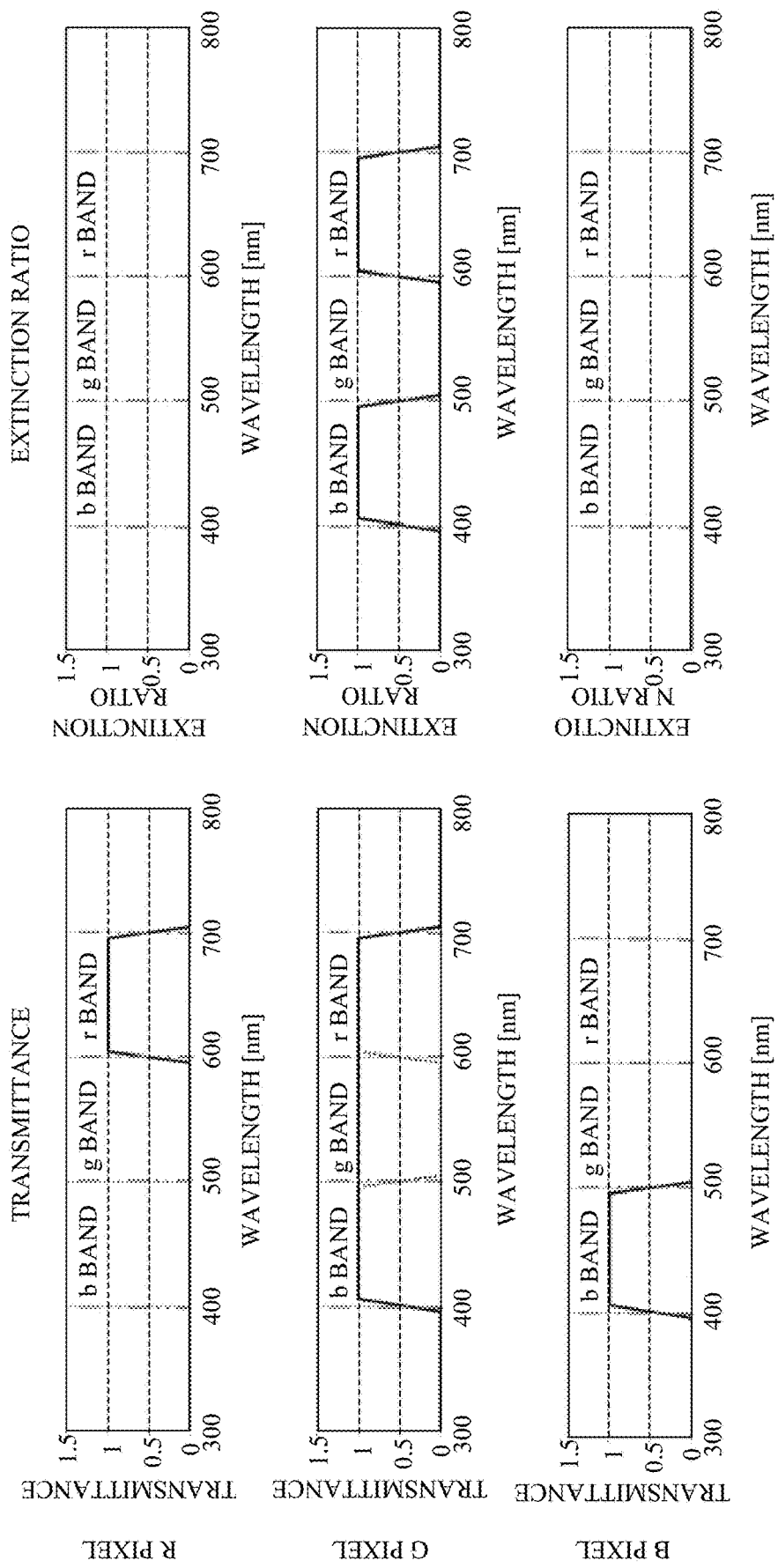
FIG. 11 provides diagrams illustrating the transmittance characteristics of the polarizing color pixels in the image sensor according to a third embodiment.

FIG. 11 provides diagrams illustrating the transmittance characteristic of the polarizing color pixel of the image sensor 12 in this embodiment. In the image sensor 12 in this embodiment, the transmitted wavelength bandwidth of the G pixel group consists of three wavelength bandwidths of r, g, and b. The transmitted wavelength bandwidths in the two pixel groups of R and B consists of the r wavelength bandwidth and b wavelength bandwidth, respectively. In addition, the transmitted wavelength bandwidth in the G pixel group includes the polarized transmitted wavelength bandwidth and the non-polarized transmitted wavelength bandwidth. The transmitted wavelength bandwidths of the two pixel groups of R and B consist of the polarized transmitted wavelength bandwidth only. The average transmittance T is 5/6 in the G pixel, and the average transmittance T is 1/6 in the R pixel and the B pixel.

The image sensor 12 in this embodiment is an image sensor in which the G pixel in the comparative example 1 is replaced with the G pixel in the first embodiment 1. The image sensor 12 in this embodiment partially includes the pixels of the present invention, and thus has improved sensitivity compared with that of the image sensor in the comparative example 1. In the image sensor 12 in this embodiment, when the same number of R, G and B pixels are arranged like the polarizing pixel arrangement in FIG. 9B, the average transmittance T of all the pixels in this embodiment is 7/18, which is larger than that in the comparative example (T=1/6).

From the first embodiment, this embodiment differs in that the R and B pixels have one wavelength bandwidth only as the transmitted wavelength bandwidth, respectively. In this embodiment, in the R and B pixels, since each transmitted wavelength bandwidth is the polarized transmitted wavelength bandwidth having the extinction ratio ER of 0, the calculation accuracy of the polarization information on the r and b wavelength bandwidths is higher than that in the first embodiment. On the other hand, in the R and B pixels, since the average transmittance T is as small as 1/6, the sensitivity of the image sensor 12 is not good as that in the first embodiment.

Fourth Embodiment

Figure 12:
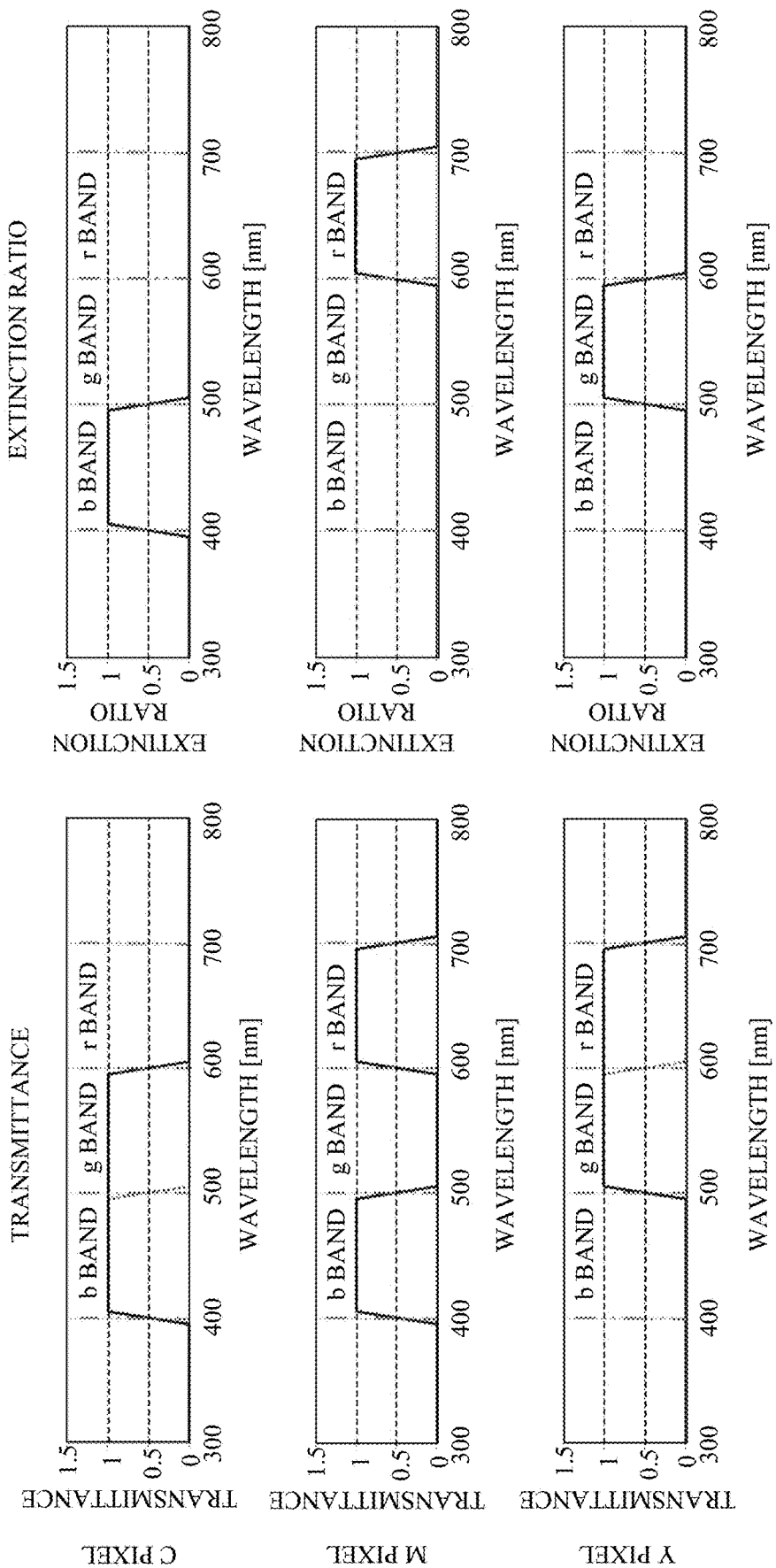
FIG. 12 provides diagrams illustrating the transmittance characteristics of the polarizing color pixels in the image sensor according to a fourth embodiment.

FIG. 12 provides diagrams illustrating the wavelength characteristics in the transmitting ratio and the extinction ratio of the polarizing color pixel in the image sensor 12 in this embodiment. The image sensor 12 in this embodiment is composed of three types color pixel groups of C, M, and Y. The transmitted wavelength bandwidths of the three types of color pixel groups of C, M, and Y are composed of two wavelength bandwidths of g and b, r and b, and r and g, respectively. In each color pixel group, the transmitted wavelength bandwidth consists of the polarized transmitted wavelength bandwidth and the non-polarized transmitted wavelength bandwidth. The average transmittance T is 1/2 in each polarizing color pixel.

Figure 13:
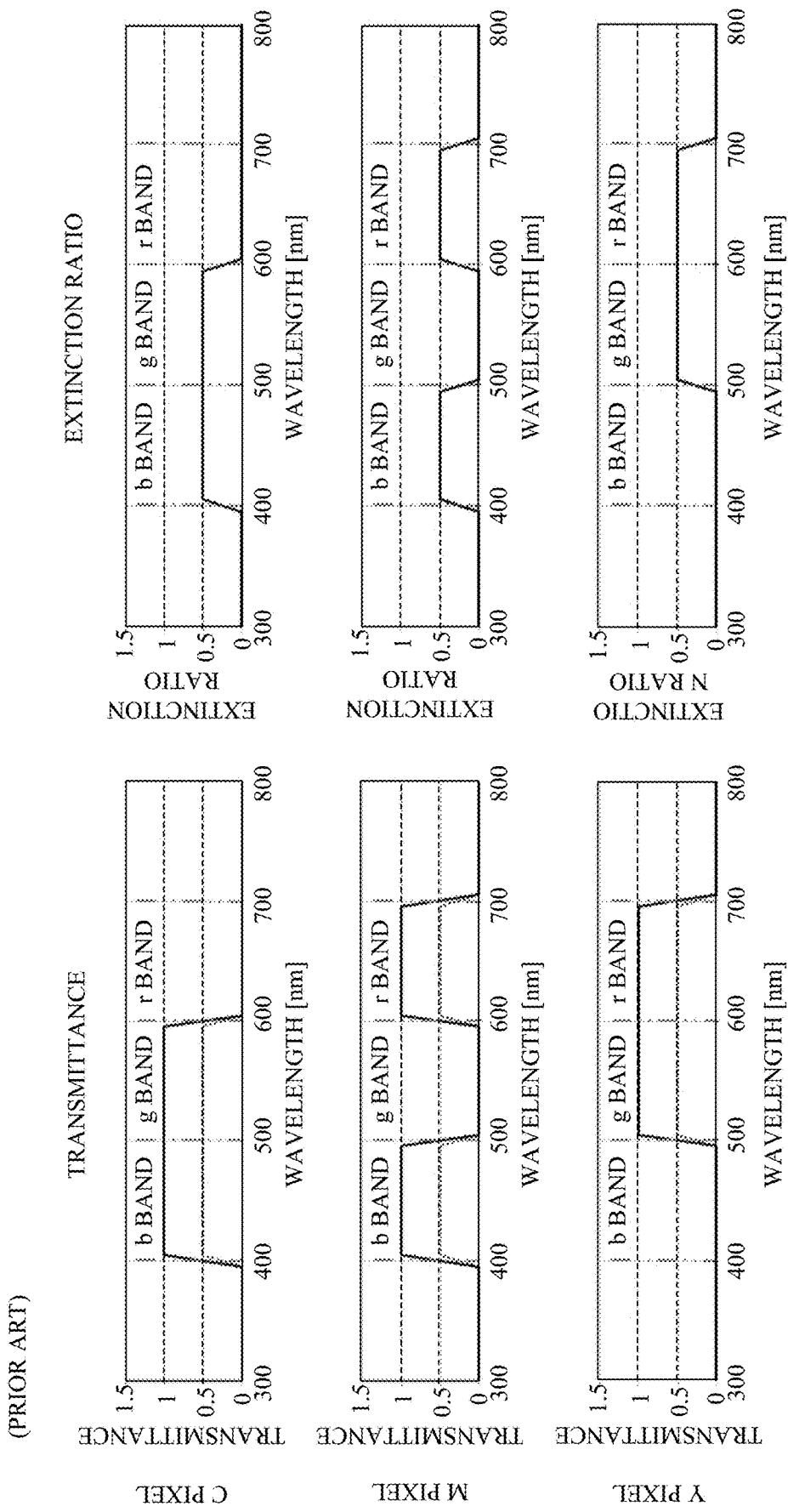
FIG. 13 provides diagrams illustrating the transmittance characteristics of the polarizing color pixels in the image sensor according to a comparative example 2.
Figures 14D, 14E, 14F:
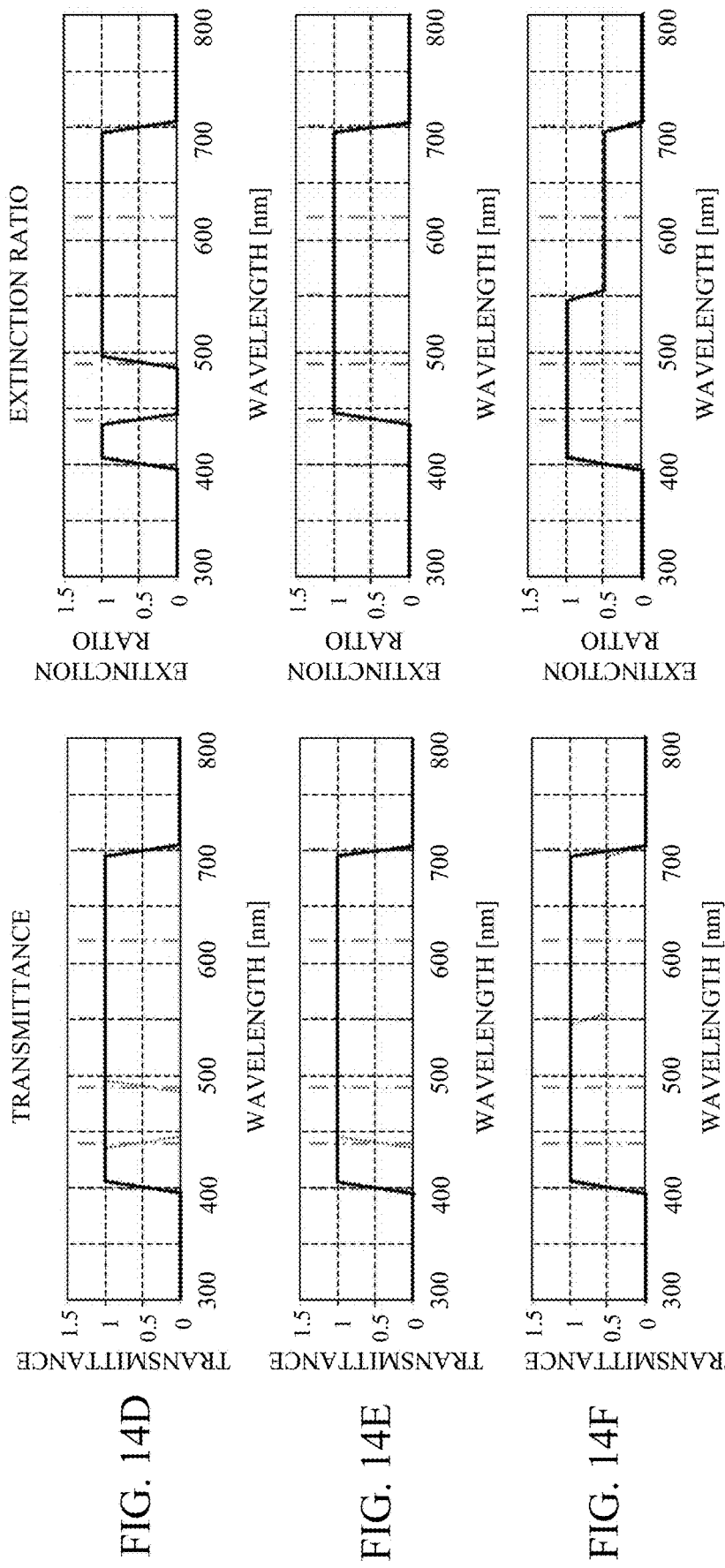
Figures 14G, 14H, 14I:
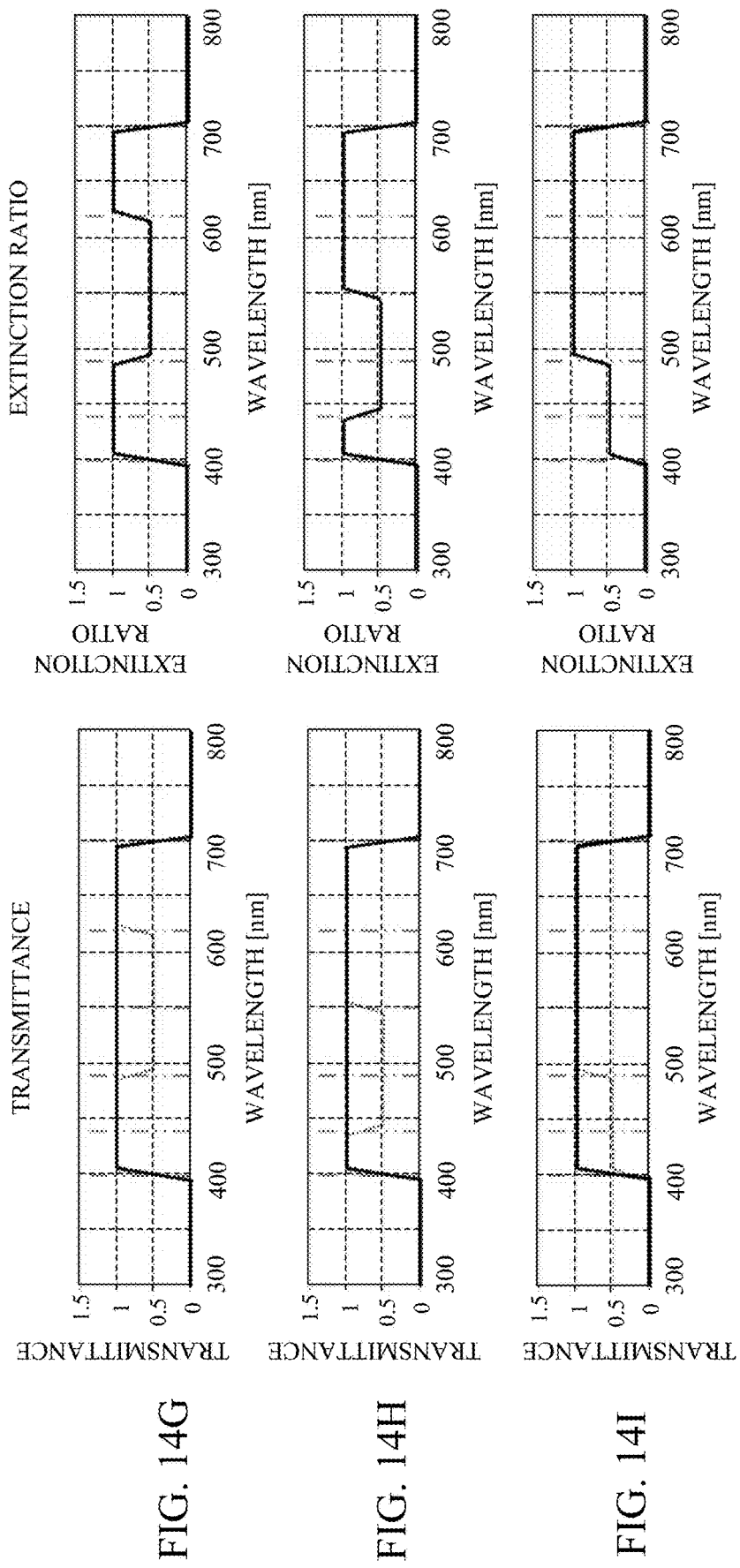

In the image sensor 12 of this embodiment, a spectral filter is added to each polarizing color pixel of the image sensor 12 in the first embodiment. Each spectral filter restricts the transmitted wavelength bandwidth FIG. 13 provides diagrams illustrating the transmittance characteristics of the polarizing color pixel in the image sensor having the spectral filter for restricting the transmitted wavelength bandwidth of a comparative example 2 and the polarizing color filter having the polarizing filter with the extinction ratio ER of 0.5 in each wavelength bandwidth. In each color pixel group in the comparative example 2, the transmitted wavelength bandwidth consists of the polarized transmitted wavelength bandwidth only. By using the polarizing filter with the extinction ratio ER of 0.5, the image sensor has the average transmittance T of 1/2, which is larger than the average transmittance T (=1/3) at the time of using the polarizing filter with the extinction ratio ER of 0, and increases its sensitivity.

The image sensor 12 in this embodiment has the average transmittance T of 1/2, which is equal to the image sensor in the comparative example 2 and has the same sensitivity as the image sensor in the comparative example 2. On the other hand, in this embodiment, only part of the transmitted wavelength bandwidth of each color pixel is the polarized transmitted wavelength bandwidth, but in the comparative example 2, all the transmitted wavelength bandwidths of each color pixel are the polarized transmitted wavelength bandwidth. Thus, for example, when the polarization direction varies of the r wavelength bandwidth in the incident light, only the luminance information in the Y pixel varies in the image sensor 12 in this embodiment, but in the image sensor in the comparative example 2, the luminance information varies in the M and Y pixels. Further, the variation amount in the Y pixel in this embodiment is twice the variation amount in the M and Y pixels of the comparative example 2. As described above, the image sensor 12 in this embodiment has higher separation accuracy of the polarization component than that of the image sensor in the comparative example 2.

As described above, the image sensor 12 in this embodiment has the same sensitivity and the high separation accuracy of the polarization component when compared with the image sensor in the comparative example 2.

Fifth Embodiment

FIGS. 14A to 14I are diagrams illustrating the transmittance characteristics of the polarizing color pixel of the image sensor 12 in this embodiment. The image sensor 12 in this embodiment has nine color pixel groups of first to ninth color pixel groups, and the transmitted wavelength bandwidths are five wavelength bandwidths of first to fifth wavelength bandwidths. The transmitted wavelength bandwidths of each color pixel group are the first to fifth wavelength bandwidths. FIGS. 14A to 14I illustrate the transmittance characteristics of the first to ninth color pixel groups, respectively.

In each of the first to fifth color pixel groups, one wavelength bandwidth among the first to fifth wavelength bandwidths is the polarized transmitted wavelength bandwidth, and the extinction ratio ER is 0 in the polarized transmitted wavelength bandwidths.

In each of the sixth to ninth color pixel groups, two wavelength bandwidths of the first to fifth wavelength bandwidths are the polarized transmitted wavelength bandwidths, and the extinction ratio ER is 0.5 in the polarized transmitted wavelength bandwidths.

Compared with the image sensor 12 in the first embodiment, the image sensor 12 in this embodiment has sensitivity to a lot of wavelength bandwidths with the narrow widths. Thus, the image sensor 12 in this embodiment is a multi-spectral sensor with high color information separation accuracy.

In the image sensor 12 in this embodiment, the number of the types of the color pixels is larger than the number of the transmitted wavelength bandwidths, and thus the polarization information of each wavelength bandwidth can be acquired by a plurality of color pixels. Thereby, it is possible to accurately calculate the polarization information in each wavelength bandwidth.

Sixth Embodiment

Figure 15:
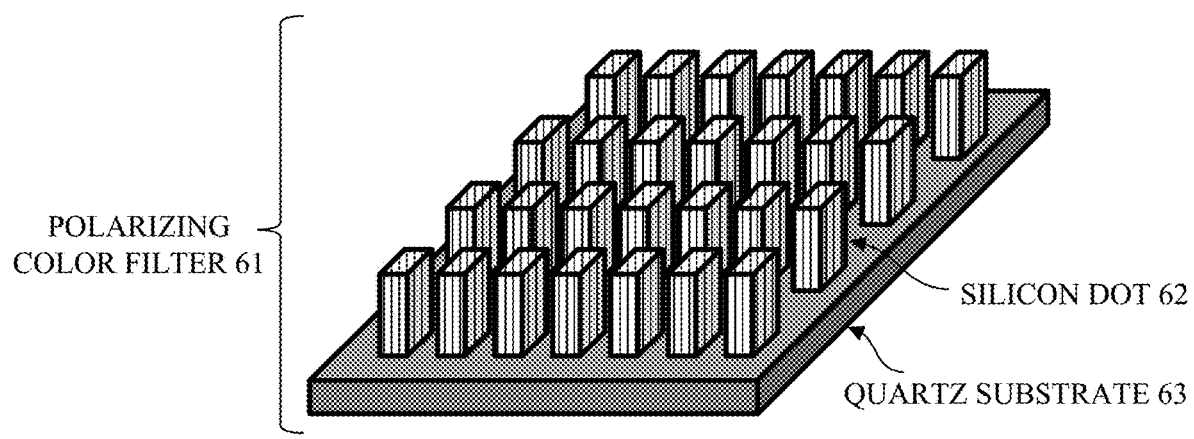
FIG. 15 is a diagram illustrating a configuration of the polarizing color filter according to a sixth embodiment.

In this embodiment, an example will be described of an element configuration that realizes the polarizing color pixel of the present invention. FIG. 15 is a diagram illustrating a structure of a polarizing color filter 61 in which rectangular parallelepiped silicon dots 62 are regularly arranged on a quartz substrate 63. The polarizing color filter 61 becomes an element having different wavelength characteristics by changing a structural parameter such as the size and period of the silicon dots 62.

Figure 16A:
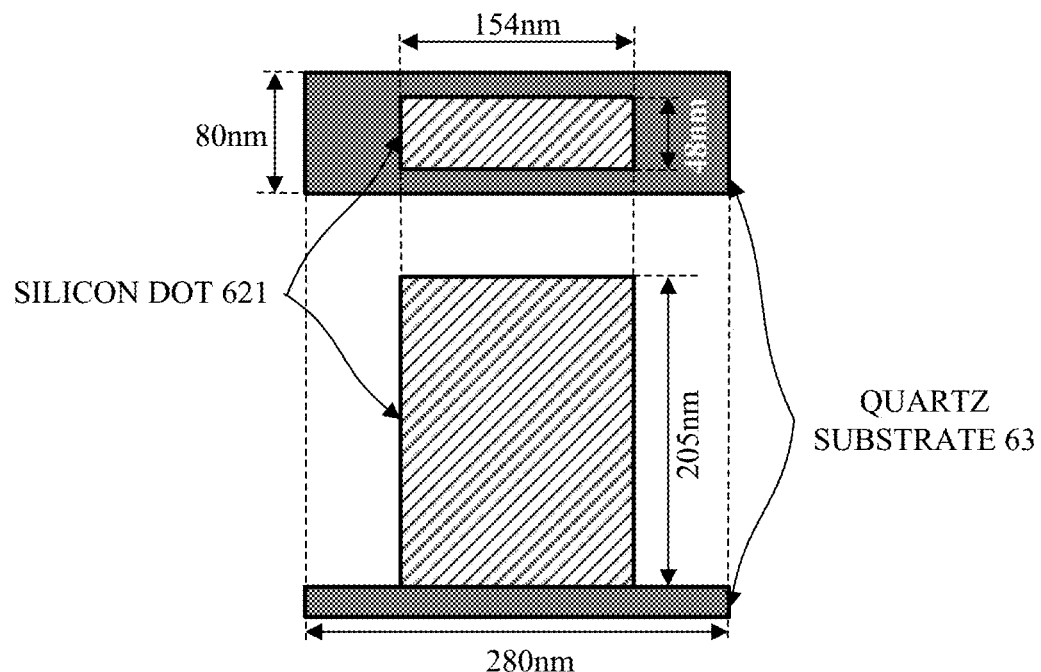
FIGS. 16A and 16B are diagrams illustrating a silicon dot structure in the polarizing color filter and the wavelength characteristic in the transmittance according to the sixth embodiment.
Figure 16B:
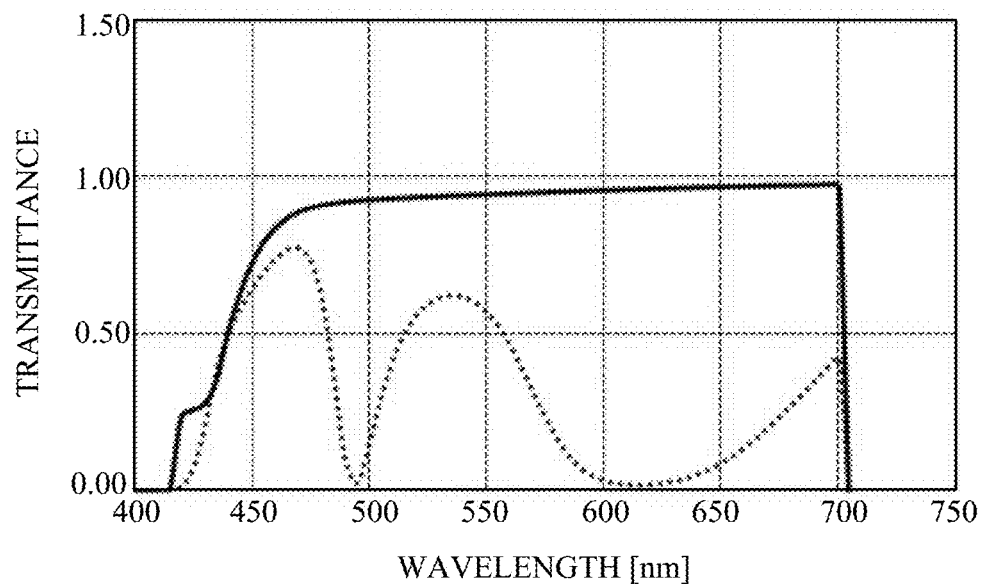
Figure 17A:
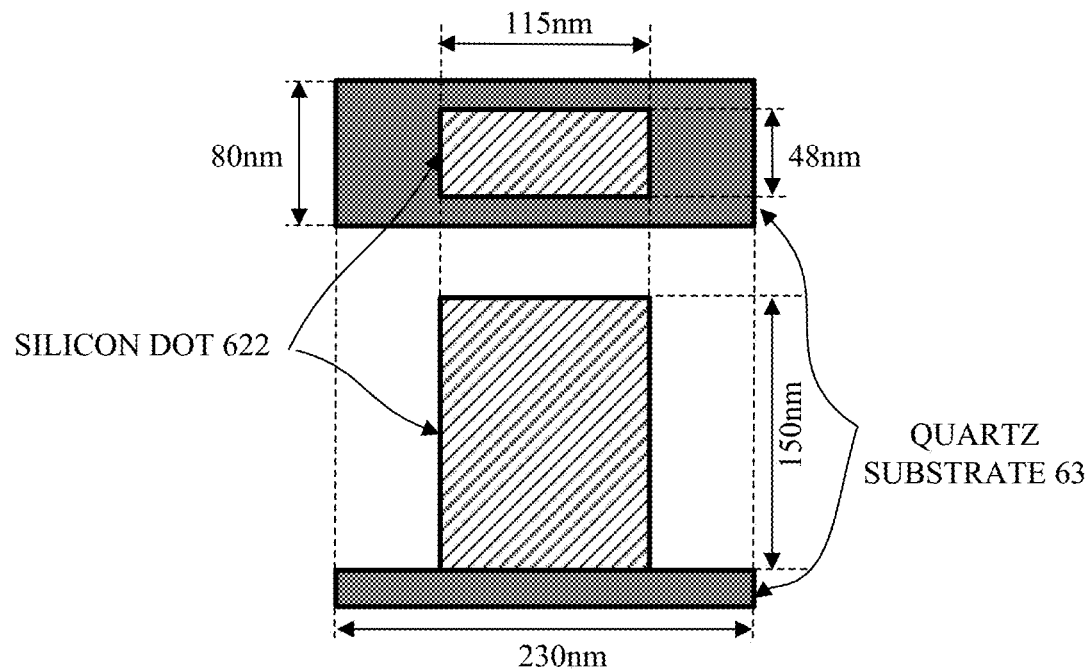
FIGS. 17A and 17B are diagrams illustrating the silicon dot structure in the polarizing color filter and the wavelength characteristic in the transmittance according to the sixth embodiment.
Figure 17B:
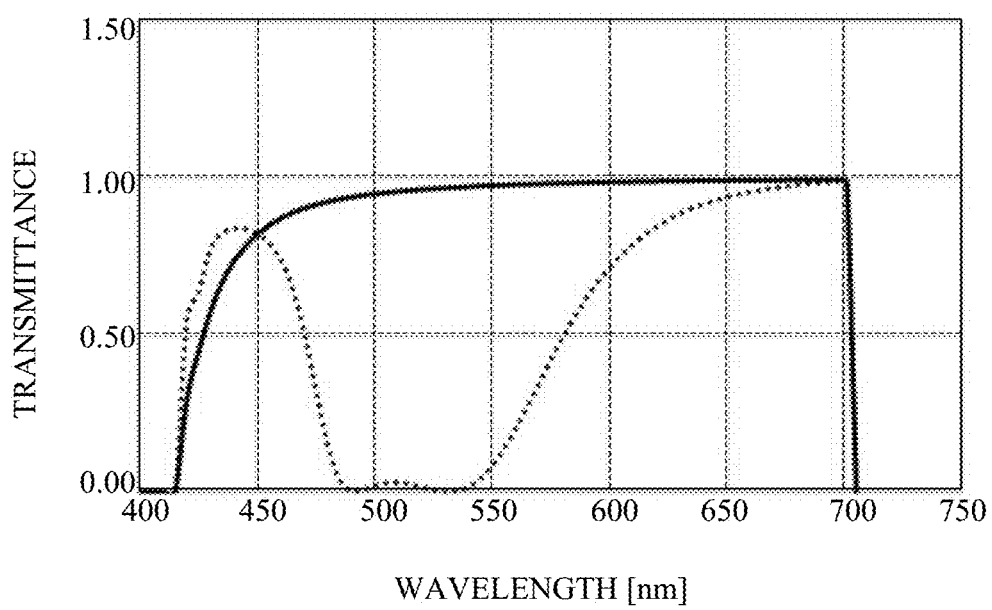
Figure 18A:
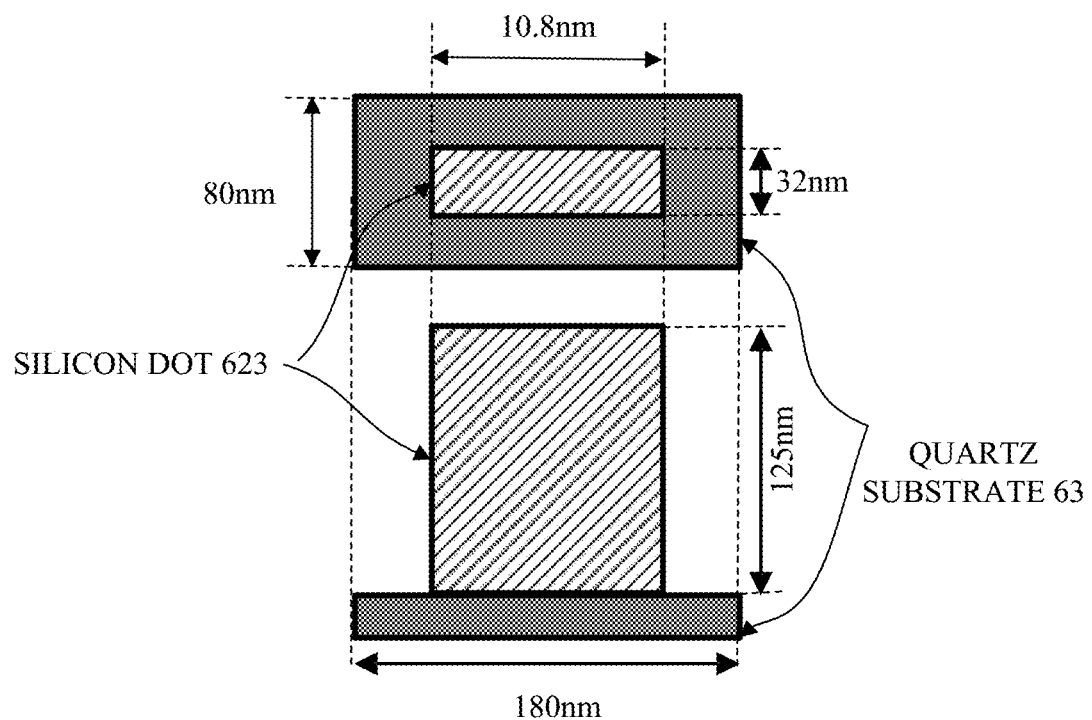
FIGS. 18A and 18B are diagrams illustrating the silicon dot structure in the polarizing color filter and the wavelength characteristic in the transmittance according to the sixth embodiment.
Figure 18B:
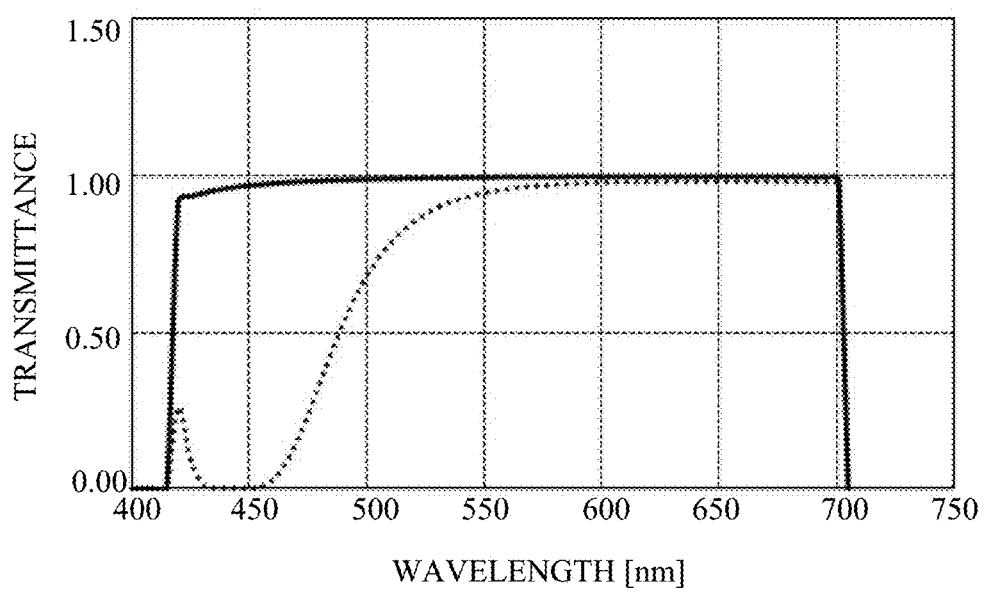

FIGS. 16A, 17A, and 18A respectively illustrate top views and side views of silicon dots 621, 622, and 623 having different structural parameters. FIGS. 16B, 17B, and 18B illustrate the wavelength characteristics in the transmittances of the polarizing color filter 61 composed of the silicon dots 621, 622, and 623, respectively. In each of FIGS. 16B, 17B, and 18B, the solid line represents the transmittance when the linear polarized light orthogonally enters the polarizing color filter 61, where the polarization direction of the linear polarization matches the major axis direction of a horizontal section of each silicon dot, and the dotted line represents the transmittance when the linear polarized light orthogonally enters the polarizing color filter 61, where the polarization direction of the linear polarized light matches the minor axis direction of the horizontal section of each silicon dot. In each filter, the major axis direction is the transmission axis direction and the minor axis direction is the orthogonal axis direction. In each filter, the major axis direction is the transmission axis direction and the minor axis direction is the orthogonal axis direction. In each of FIGS. 16B, 17B, and 18B, the wavelength characteristic includes the characteristic of a bandpass filter that selectively transmits the wavelength bandwidth of 420 nm to 700 nm, and the transmittance is 0 except the wavelength bandwidth of 420 nm to 700 nm.

In each of FIGS. 16A and 16B to 18A and 18B, the polarizing color filter 61 selectively transmits the polarization component of a specific polarization direction in some wavelength bandwidths, and transmits polarized light regardless of polarization direction in some wavelength bandwidths. The wavelength bandwidths are different where the polarization component is selectively transmitted. By arranging these elements on the pixel array, the polarizing color pixel of the present invention can be realized.

The image sensor 12 in this embodiment has the polarizing pixel arrangement as illustrated in FIG. 9C. The polarizing color filters 61 in FIGS. 16A and 16B to 18A and 18B are disposed in the R, G, and B pixels, respectively. The image sensor 12 in this embodiment has sensitivity to a first wavelength bandwidth (420 nm to 480 nm), a second wavelength bandwidth (480 nm to 580 nm), and a third wavelength bandwidth (580 nm to 700 nm).

Table 1 provides the transmittance characteristic and the average transmittance T of each wavelength bandwidth in each color pixel. In each color pixel, the first to third wavelength bandwidths are the transmitted wavelength bandwidths. In the R pixel, the second wavelength bandwidth and the third wavelength bandwidth are the polarized transmitted wavelength bandwidth, and the first wavelength bandwidth is the non-polarized transmitted wavelength bandwidth. In the G pixel, the second wavelength bandwidth is the polarized transmitted wavelength bandwidth, and the first wavelength bandwidth and the third wavelength bandwidth are the non-polarized transmitted wavelength bandwidths. In the B pixel, the first wavelength bandwidth is the polarized transmitted wavelength bandwidth, and the second wavelength bandwidth and the third wavelength bandwidth are the non-polarized transmitted wavelength bandwidths.

The average transmittances T of the R, G, and B pixels are 0.62, 0.73, and 0.81, respectively. These are higher than the average transmittance T (=1/6) in the comparative example 1, and thus the image sensor 12 in this embodiment has higher sensitivity than that in the comparative example 1.

This embodiment has provided the examples of the structure and the transmittance characteristic of the polarizing color filter, but the present invention is not limited to this embodiment. Various polarizing color filters having different wavelength bandwidths and transmittance characteristics can be acquired by changing the shapes and materials of the dot structure. This embodiment has provided the example in which the silicon dot 62 is formed on the quartz substrate 63, but the present invention is not limited to this embodiment, as long as the structures having the shape anisotropy are arranged periodically. It is also possible to directly form the silicon dot 62 on a transparent resin or on a surface of a solid image sensor. The structure may be made of at least one of silicon, bismuth ferrite, and gallium arsenide.

TABLE 1

|         |    | FIRST WAVELENGTH BANDWIDTH 420 nm-480 nm | SECOND WAVELENGTH BANDWIDTH 480 nm-580 nm | THIRD WAVELENGTH BANDWIDTH 580 nm-700 nm | T |
|---------|----|------|------|------|------|
| R PIXEL | Ts | 0.52 | 0.42 | 0.14 | 0.62 |
|         | Tp | 0.63 | 0.94 | 0.97 |      |
|         | ER | 0.76 | 0.44 | 0.14 |      |
| G PIXEL | Ts | 0.65 | 0.11 | 0.86 | 0.73 |
|         | TP | 0.75 | 0.97 | 1.00 |      |
|         | ER | 0.97 | 0.11 | 0.86 |      |
| B PIXEL | Ts | 0.10 | 0.82 | 0.99 | 0.81 |
|         | Tp | 0.97 | 0.99 | 1.00 |      |
|         | ER | 0.10 | 0.82 | 0.99 |      |

Seventh Embodiment

In this embodiment, a description will be given of an example for the polarization information calculation processing for calculating the polarization information using the information acquired in the image pickup apparatus 1 equipped with the image sensor 12 in the first embodiment that has the polarizing pixel array in FIG. 9C.

The transmission axis directions of the first to fourth polarizing pixels are 0°, 45°, 90°, and 135°, respectively. The interpolation processor 13 performs the interpolation processing on the luminance information acquired in each polarizing color pixel, in order to acquire twelve types of the polarization component information on four polarizations of three colors. Each of the twelve types of the polarization color information is represented by the following expressions (8) to (19).

$$I_{1,R} = I_{\mathit{diff}}(1)\cos(2\alpha(1))I_{ave}(1) + 2I_{ave}(2) + 2I_{ave}(3) \tag{8}$$

$$I_{2,R} = I_{\mathit{diff}}(1)\sin(2\alpha(1)) + I_{ave}(1) + 2I_{ave}(2) + 2I_{ave}(3) \tag{9}$$

$$I_{3,R} = -I_{\mathit{diff}}(1)\cos(2\alpha(1)) + I_{ave}(1) + 2I_{ave}(2) + 2I_{ave}(3) \tag{10}$$

$$I_{4,R} = -I_{\mathit{diff}}(1)\sin(2\alpha(1)) + I_{ave}(1) + 2I_{ave}(2) + 2I_{ave}(3) \tag{11}$$

$$I_{1,G} = I_{\mathit{diff}}(2)\cos(2\alpha(2)) + 2I_{ave}(1) + I_{ave}(2) + 2I_{ave}(3) \tag{12}$$

$$I_{2,G} = I_{\mathit{diff}}(2)\sin(2\alpha(2)) + 2I_{ave}(1) + I_{ave}(2) + 2I_{ave}(3) \tag{13}$$

$$I_{3,G} = I_{\mathit{diff}}(2)\cos(2\alpha(2)) + 2I_{ave}(1) + I_{ave}(2) + 2I_{ave}(3) \tag{14}$$

$$I_{4,G} = -I_{\mathit{diff}}(2)\sin(2\alpha(2)) + 2I_{ave}(1) + I_{ave}(2) + 2I_{ave}(3) \tag{15}$$

$$I_{1,B} = I_{\mathit{diff}}(3)\cos(2\alpha(3)) + 2I_{ave}(1) + 2I_{ave}(2) + I_{ave}(3) \tag{16}$$

$$I_{2,B} = I_{\mathit{diff}}(3)\sin(2\alpha(3)) + 2I_{ave}(1) + 2I_{ave}(2) + I_{ave}(3) \tag{17}$$

$$I_{3,B} = -I_{\mathit{diff}}(3)\cos(2\alpha(3)) + 2I_{ave}(1) + 2I_{ave}(2) + I_{ave}(3) \tag{18}$$

$$I_{4,B} = -I_{\mathit{diff}}(3)\sin(2\alpha(3)) + 2I_{ave}(1) + 2I_{ave}(2) + I_{ave}(3) \tag{19}$$

Here, $I_{diff}(\lambda)$ and $I_{ave}(\lambda)$ are expressed by the following expressions (20) and (21), respectively.

$$I_{diff}(\lambda) = \frac{Imax(\lambda) - Imin(\lambda)}{2} \quad (20)$$

$$I_{ave}(\lambda) = \frac{Imax(\lambda) + Imin(\lambda)}{2} \quad (21)$$

By solving the twelve expressions of the expressions (8) to (19) for $\alpha$, $I_{diff}$, and Iave, the following expressions (22) to (30) are obtained.

$$\alpha(1) = \frac{1}{2}\tan^{-1}\left(\frac{I_{1,R} - I_{3,R}}{I_{2,R} - I_{4,R}}\right) \quad (22)$$

$$\alpha(2) = \frac{1}{2}\tan^{-1}\left(\frac{I_{1,G} - I_{3,G}}{I_{2,G} - I_{4,G}}\right) \quad (23)$$

$$\alpha(3) = \frac{1}{2}\tan^{-1}\left(\frac{I_{1,B} - I_{3,B}}{I_{2,B} - I_{4,B}}\right) \quad (24)$$

$$I_{diff}(1) = \sqrt{2}\sqrt{(I_{1,R} - I_{3,R})^2 + (I_{2,R} - I_{4,R})^2} \quad (25)$$

$$I_{diff}(2) = \sqrt{2}\sqrt{(I_{1,G} - I_{3,G})^2 + (I_{2,G} - I_{4,G})^2} \quad (26)$$

$$I_{diff}(3) = \sqrt{2}\sqrt{(I_{1,B} - I_{3,B})^2 + (I_{2,B} - I_{4,B})^2} \quad (27)$$

$$I_{ave}(1) = \frac{2}{5}(I_{1,G} + I_{2,G} + I_{3,G} + I_{4,G}) + \frac{2}{5}(I_{1,B} + I_{2,B} + I_{3,B} + I_{4,B}) - \frac{3}{5}(I_{1,R} + I_{2,R} + I_{3,R} + I_{4,R}) \quad (28)$$

$$I_{ave}(2) = \frac{2}{5}(I_{1,R} + I_{2,R} + I_{3,R} + I_{4,R}) + \frac{2}{5}(I_{1,B} + I_{2,B} + I_{3,B} + I_{4,B}) - \frac{3}{5}(I_{1,G} + I_{2,G} + I_{3,G} + I_{4,G}) \quad (29)$$

$$I_{ave}(3) = \frac{2}{5}(I_{1,R} + I_{2,R} + I_{3,R} + I_{4,R}) + \frac{2}{5}(I_{1,G} + I_{2,G} + I_{3,G} + I_{4,G}) - \frac{3}{5}(I_{1,B} + I_{2,B} + I_{3,B} + I_{4,B}) \quad (30)$$

In the expressions (22) to (30), the polarization information (left side) of the first to third wavelength bandwidths is represented by the polarization component information of each polarizing color pixel.

As described above, the polarization information of the first to third wavelength bandwidths can be calculated from the luminance information acquired in each polarizing color pixel in this embodiment.

Each of the above-described embodiment can provide the image sensor that can suppress the decrease in the sensitivity and the decrease in the separation accuracy of the polarization component, and the image pickup apparatus having the same.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-133262, filed on Jul. 19, 2019 which is hereby incorporated by reference herein in its entirety.

What is claimed is:

1. An image sensor comprising a first polarizing pixel and a second polarizing pixel,
   wherein a first transmission axis direction of the first polarizing pixel and a second transmission axis direction of the second polarizing pixel are different from each other,
   wherein each of the first and second polarizing pixels has a same wavelength characteristic in transmittance,
   wherein each of the first and second polarizing pixels has a sensitivity to a first wavelength bandwidth and a second wavelength bandwidth,
   wherein, in the first polarizing pixel,
   a ratio of transmittance in the first transmission axis direction in the first wavelength bandwidth to a maximum value of transmittance in the first transmission axis direction in all wavelength bandwidths is 0.5 or more,
   a ratio of transmittance in the first transmission axis direction in the second wavelength bandwidth to the maximum value of the transmittance in the first transmission axis direction in all wavelength bandwidths is 0.5 or more,
   in the first wavelength bandwidth, a ratio of transmittance in a direction orthogonal to the first transmission axis direction to the transmittance in the first transmission axis direction is 0.5 or more, and
   in the second wavelength bandwidth, a ratio of the transmittance in the direction orthogonal to the first transmission axis direction to the transmittance in the first transmission axis direction is 0.5 or less, and
   wherein, in the second polarizing pixel,
   a ratio of transmittance in the second transmission axis direction in the first wavelength bandwidth to a maximum value of transmittance in the second transmission axis direction in all wavelength bandwidths is 0.5 or more, a ratio of transmittance in the second transmission axis direction in the second wavelength bandwidth to the maximum value of the transmittance in the second transmission axis direction in all wavelength bandwidths is 0.5 or more, in the first wavelength bandwidth, a ratio of transmittance in a direction orthogonal to the second transmission axis direction to the transmittance in the second transmission axis direction is 0.5 or more, and in the second wavelength bandwidth, a ratio of the transmittance in the direction orthogonal to the second transmission axis direction to the transmittance in the second transmission axis direction is 0.5 or less.

2. The image sensor according to claim 1,
wherein each of the first and second polarizing pixels includes one light receiving element.

3. The image sensor according to claim 1,
wherein, in the first polarizing pixel,
the ratio of the transmittance in the first transmission axis direction in the first wavelength bandwidth to the maximum value of the transmittance in the first transmission axis direction is 0.8 or more,
the ratio of the transmittance in the first transmission axis direction in the second wavelength bandwidth to the maximum value of the transmittance in the first transmission axis direction in all wavelength bandwidths is 0.8 or more, and wherein, in the second polarizing pixel,
the ratio of the transmittance in the second transmission axis direction in the first wavelength bandwidth to the maximum value of the transmittance in the second transmission axis direction is 0.8 or more,
the ratio of the transmittance in the second transmission axis direction in the second wavelength bandwidth to the maximum value of the transmittance in the second transmission axis direction is 0.8 or more.

4. The image sensor according to claim 1,
wherein in the first polarizing pixel, a ratio of the transmittance in the first transmission axis direction in all the wavelength bandwidths to which the image sensor has the sensitivity to the maximum value of the transmittance in the first transmission axis direction is 0.5 or more.

5. The image sensor according to claim 4,
wherein the ratio of the transmittance in the first transmission axis direction in all the wavelength bandwidths to which the image sensor has the sensitivity to the maximum value of the transmittance in the first transmission axis direction is 0.8 or more.

6. The image sensor according to claim 1,
wherein the image sensor has the sensitivity to a third wavelength bandwidth, and
wherein in the first polarizing pixel, a ratio of the transmittance in the first transmission axis direction in the third wavelength bandwidth to the maximum value of the transmittance in the first transmission axis direction is 0.2 or less.

7. The image sensor according to claim 1,
wherein the image sensor includes a plurality of first polarizing pixels,
wherein the plurality of the first polarizing pixels includes a third polarizing pixel and a fourth polarizing pixel,
wherein the maximum value of the transmittance in the first transmission axis direction of the third polarizing pixel is the smallest among maximum values of transmittances in the first transmission axis direction of all pixels included in the plurality of the first polarizing pixels,
wherein the maximum value of the transmittance in the first transmission axis direction of the fourth polarizing pixel is the largest among the maximum values of the transmittances in the first transmission axis direction of all the pixels included in the plurality of the first polarizing pixels, and
wherein a following conditional expression is satisfied:

$$0.8 \leq T{pnc\_max}/T{pnc'\_max} \leq 1.0$$

where $T{pnc\_max}$ is the maximum value of the transmittance in the first transmission axis direction of the third polarizing pixel, and $T{pnc'\_max}$ is the maximum value of the transmittance in the first transmission axis direction of the fourth polarizing pixel.

8. The image sensor according to claim 1,
wherein the image sensor includes a plurality of first polarizing pixels,
wherein the plurality of the first polarizing pixels includes a third polarizing pixel and a fourth polarizing pixel,
wherein an average transmittance of the third polarizing pixel is the smallest among average transmittances of all pixels included in the plurality of the first polarizing pixels,
wherein the average transmittance of the fourth polarizing pixel is the largest among the average transmittances of all the pixels included in plurality of the first polarizing pixels, and
wherein the following conditional expression is satisfied:

$$0.8 \leq Tnc/Tnc' \leq 1.0$$

where $Tnc$ is the average transmittance of the third polarizing pixel, and $Tnc'$ is the average transmittance of the fourth polarizing pixel.

9. The image sensor according to claim 1,
wherein the image sensor includes a plurality of first polarizing pixels,
wherein the plurality of the first polarizing pixels includes a third polarizing pixel and a fourth polarizing pixel,
wherein in the third polarizing pixel, the ratio of the transmittance in the direction orthogonal to the first transmission axis direction to the transmittance in the first transmission axis direction is 0.5 or less in the first wavelength bandwidth, and the ratio of the transmittance in the direction orthogonal to the first transmission axis direction to the transmittance in the first transmission axis direction is 0.5 or more in the second wavelength bandwidth, and
wherein in the fourth polarizing pixel, the ratio of the transmittance in the direction orthogonal to the first transmission axis direction to the transmittance in the first transmission axis direction is 0.5 or less in the second wavelength bandwidth, and the ratio of the transmittance in the direction orthogonal to the first transmission axis direction to the transmittance in the first transmission axis direction is 0.5 or more in the first wavelength bandwidth.

10. The image sensor according to claim 1,
wherein the image sensor includes a plurality of first polarizing pixels,
wherein the plurality of the first polarizing pixels includes a plurality of polarizing pixels,
wherein the number of vectors linearly independent of each other among vectors V1 is larger than the number of wavelength bandwidths to which the image sensor has the sensitivity, where each of the vectors V1 has, as an element, each difference between the transmittance in the first transmission axis direction and the transmittance in the direction orthogonal to the first transmission axis direction in each of all the wavelength bandwidths to which the image sensor has the sensitivity, in one of the plurality of the polarizing pixels, and wherein the number of the vectors linearly independent of each other among vectors V2 is larger than the number of wavelength bandwidths to which the image sensor has the sensitivity, where each of the vectors V2 has, as the element, each sum of the transmittance in the first transmission axis direction and the transmittance in the direction orthogonal to the first transmission axis direction in each of all the wavelength bandwidths to which the image sensor has the sensitivity, in one of the plurality of the polarizing pixels.

11. The image sensor according to claim 1,
wherein, in the first polarizing pixel,
in the first and second wavelength bandwidth, the ratio of the transmittance in the direction orthogonal to the first transmission axis direction to the transmittance in the first transmission axis direction is 0.2 or less, and wherein, in the second polarizing pixel,
in the second wavelength bandwidth, the ratio of the transmittance in the direction orthogonal to the second transmission axis direction to the transmittance in the second transmission axis direction is 0.2 or less.

12. The image sensor according to claim 1, further comprising
a polarizing color filter including a periodically disposed structure having a shape anisotropy.

13. The image sensor according to claim 12,
wherein the structure includes at least one of silicon, bismuth ferrite, and gallium arsenide.

14. An image pickup apparatus comprising:
the image sensor according to claim 1; and
at least one processor or circuit configured to execute a task of:
processing an output from the image sensor.

15. The image pickup apparatus according to claim 14,
wherein the at least one processor or circuit configured to execute a task of:
calculating polarization information using an output from the processing task.

* * * * *